United States Patent
Cho et al.

(10) Patent No.: US 11,594,604 B2
(45) Date of Patent: Feb. 28, 2023

(54) SEMICONDUCTOR DEVICE INCLUDING A GATE STRUCTURE

(71) Applicant: SAMSUNG ELECTRONICS CO., LTD., Suwon-si (KR)

(72) Inventors: Namgyu Cho, Seoul (KR); Minwoo Song, Seongnam-si (KR); Ohseong Kwon, Hwaseong-si (KR); Wandon Kim, Seongnam-si (KR); Hyeokjun Son, Seoul (KR); Jinkyu Jang, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 17/388,269

(22) Filed: Jul. 29, 2021

(65) Prior Publication Data
US 2022/0130972 A1    Apr. 28, 2022

(30) Foreign Application Priority Data

Oct. 23, 2020   (KR) .................. 10-2020-0138208

(51) Int. Cl.
*H01L 29/417* (2006.01)
*H01L 29/78* (2006.01)
(Continued)

(52) U.S. Cl.
CPC .... *H01L 29/41791* (2013.01); *H01L 29/0673* (2013.01); *H01L 29/41733* (2013.01); *H01L 29/4236* (2013.01); *H01L 29/42392* (2013.01); *H01L 29/66439* (2013.01); *H01L 29/66545* (2013.01); *H01L 29/66795* (2013.01);
(Continued)

(58) Field of Classification Search
CPC ........... H01L 29/41791; H01L 29/0673; H01L 29/41733; H01L 29/4236; H01L 29/42392; H01L 29/66439; H01L 29/66545; H01L 29/66795; H01L 29/775; H01L 29/7854; H01L 29/7855; H01L 29/78696; H01L 29/4966; H01L 29/7848
See application file for complete search history.

(56) References Cited

U.S. PATENT DOCUMENTS 7,354,832 B2 * 4/2008 Rachmady ........ H01L 29/66795
                                              438/176
9,466,494 B2 * 10/2016 Wu ................... H01L 21/76831
(Continued)

*Primary Examiner* — Earl N Taylor
(74) *Attorney, Agent, or Firm* — F. Chau & Associates, LLC

(57) ABSTRACT

A semiconductor device includes: an active fin disposed on a substrate; a gate structure overlapping the active fin; source/drain regions disposed on both sides of the gate structure and on the active fin; and contact structures respectively connected to the source/drain regions, wherein the gate structure includes: a pair of gate spacers spaced apart from each other to provide a trench; a first gate electrode disposed in the trench and extending along an upper surface and a lateral surface of the active fin; a second gate electrode disposed on the first gate electrode in the trench, wherein the first gate electrode is not disposed between the second gate electrode and the pair of gate spacers; and a gate insulating film disposed between the pair of gate spacers and interposed between the first gate electrode and the active fin.

20 Claims, 23 Drawing Sheets

(51) Int. Cl.
*H01L 29/786* (2006.01)
*H01L 29/49* (2006.01)
*H01L 29/423* (2006.01)
*H01L 29/06* (2006.01)
*H01L 29/775* (2006.01)
*H01L 29/66* (2006.01)

(52) U.S. Cl.
CPC ........ *H01L 29/775* (2013.01); *H01L 29/7854* (2013.01); *H01L 29/7855* (2013.01); *H01L 29/78696* (2013.01); *H01L 29/4966* (2013.01); *H01L 29/7848* (2013.01)

(56) References Cited

U.S. PATENT DOCUMENTS

| | | | |
|---|---|---|---|
| 9,972,494 B1 * | 5/2018 | Bentley | H01L 29/66666 |
| 10,388,525 B2 * | 8/2019 | Bergendahl | H01L 21/0337 |
| 2018/0069095 A1 * | 3/2018 | Chang | H01L 29/6656 |
| 2018/0076034 A1 * | 3/2018 | Bergendahl | H01L 21/31116 |
| 2019/0164766 A1 * | 5/2019 | Huang | H01L 21/823821 |
| 2019/0165116 A1 * | 5/2019 | Lim | H01L 29/1033 |
| 2019/0333769 A1 * | 10/2019 | Chen | H01L 21/28088 |
| 2019/0355823 A1 * | 11/2019 | Lin | H01L 29/41791 |
| 2020/0044037 A1 * | 2/2020 | Tai | H01L 29/41791 |
| 2020/0052106 A1 * | 2/2020 | Economikos | H01L 21/823431 |
| 2021/0028290 A1 * | 1/2021 | Hsiao | H01L 29/4966 |
| 2022/0069100 A1 * | 3/2022 | Hwang | H01L 29/0847 |
| 2022/0115375 A1 * | 4/2022 | Xu | H01L 21/823878 |
| 2022/0130972 A1 * | 4/2022 | Cho | H01L 29/66545 |
| 2022/0149177 A1 * | 5/2022 | Lee | H01L 21/02603 |

* cited by examiner

II2-II2'

A

B

SEMICONDUCTOR DEVICE INCLUDING A GATE STRUCTURE

CROSS-REFERENCE TO RELATED APPLICATION

This application claims priority under 35 USC 119(a) to Korean Patent Application No. 10-2020-0138208 filed on Oct. 23, 2020 in the Korean Intellectual Property Office, the disclosure of which is incorporated by reference herein in its entirety.

TECHNICAL FIELD

The present inventive concept relates to a semiconductor device, and more particularly, to a semiconductor device including a gate structure.

DISCUSSION OF THE RELATED ART

As demand for high performance, high speed, and/or multifunctionality in semiconductor devices has increased, demand for an increased degree of integration of semiconductor devices has also increased. To meet the demand for a high degree of integration of semiconductor devices, semiconductor devices having a three-dimensional structure channel is currently under development.

SUMMARY

According to an exemplary embodiment of the present inventive concept, a semiconductor device includes: at least one active fin disposed on a substrate and extending in a first direction; a gate structure overlapping the at least one active fin and extending in a second direction intersecting the first direction; source/drain regions disposed on both sides of the gate structure and on the at least one active fin; and contact structures respectively connected to the source/drain regions, and extending in a third direction substantially perpendicular to the first and second directions, wherein the gate structure includes: a pair of gate spacers spaced apart from each other in the first direction to provide a trench, and extending in the second direction; a first gate electrode disposed in the trench and extending along an upper surface and a lateral surface of the at least one active fin in the second direction; a second gate electrode disposed on the first gate electrode in the trench, wherein the first gate electrode is not disposed between the second gate electrode and the pair of gate spacers; and a gate insulating film disposed between the pair of gate spacers and interposed between the first gate electrode and the at least one active fin.

According to an exemplary embodiment of the present inventive concept, a semiconductor device includes: at least one active fin disposed on a substrate and extending in a first direction; a pair of gate spacers spaced apart from each other at a predetermined distance in the first direction and extending in a second direction intersecting the first direction; a first gate insulating film disposed between the pair of gate spacers and along an upper surface and a lateral surface of the at least one active fin in the second direction; a second gate insulating film having a first portion, a second portion and a third portion, wherein the first portion is disposed on the first gate insulating film, wherein the second and third portions extend from the first portion and along an inner sidewall of each of the pair of gate spacers, respectively, and wherein a thickness of each of the second and third portions is less than a thickness of the first portion; a first gate electrode disposed on the first portion of the second gate insulating film between the pair of gate spacers; a second gate electrode disposed on the first gate electrode between the pair of gate spacers and overlap the second and third portions of the second gate insulating film; source/drain regions disposed in portions of the at least one active fin adjacent to the pair of gate spacers; and contact structures respectively connected to the source/drain regions, and extending in a third direction substantially perpendicular to the first and second directions.

According to an exemplary embodiment of the present inventive concept, a semiconductor device includes: at least one active fin disposed on a substrate and extending in a first direction; a pair of gate spacers spaced apart from each other at a predetermined distance in the first direction and extending in a second direction intersecting the first direction; a first gate insulating film disposed between the pair of gate spacers and along an upper surface and a lateral surface of the at least one active fin in the second direction; a second gate insulating film having a first portion, a second portion and a third portion, wherein the first portion is disposed on the first gate insulating film, wherein the second and third portions extend from the first portion and along an inner sidewall of each of the pair of gate spacers, respectively, and wherein a thickness of the second portion is less than a thickness of the first portion; a first gate electrode disposed between the pair of gate spacers and having a third portion and a fourth portion, wherein the third portion contacts the first portion of the second gate insulating film, wherein the fourth portion contacts the second portion of the second gate insulating film, wherein a thickness of the fourth portion is less than the thickness of the first portion; and a second gate electrode disposed on the first gate electrode between the pair of gate spacers.

BRIEF DESCRIPTION OF DRAWINGS

The above and other features of the present inventive concept will become more apparent by describing in detail exemplary embodiments thereof, with reference to the accompanying drawings, in which.

DETAILED DESCRIPTION OF THE EMBODIMENTS

Hereinafter, exemplary embodiments of the present inventive concept will be described with reference to the accompanying drawings.

Figure 1:
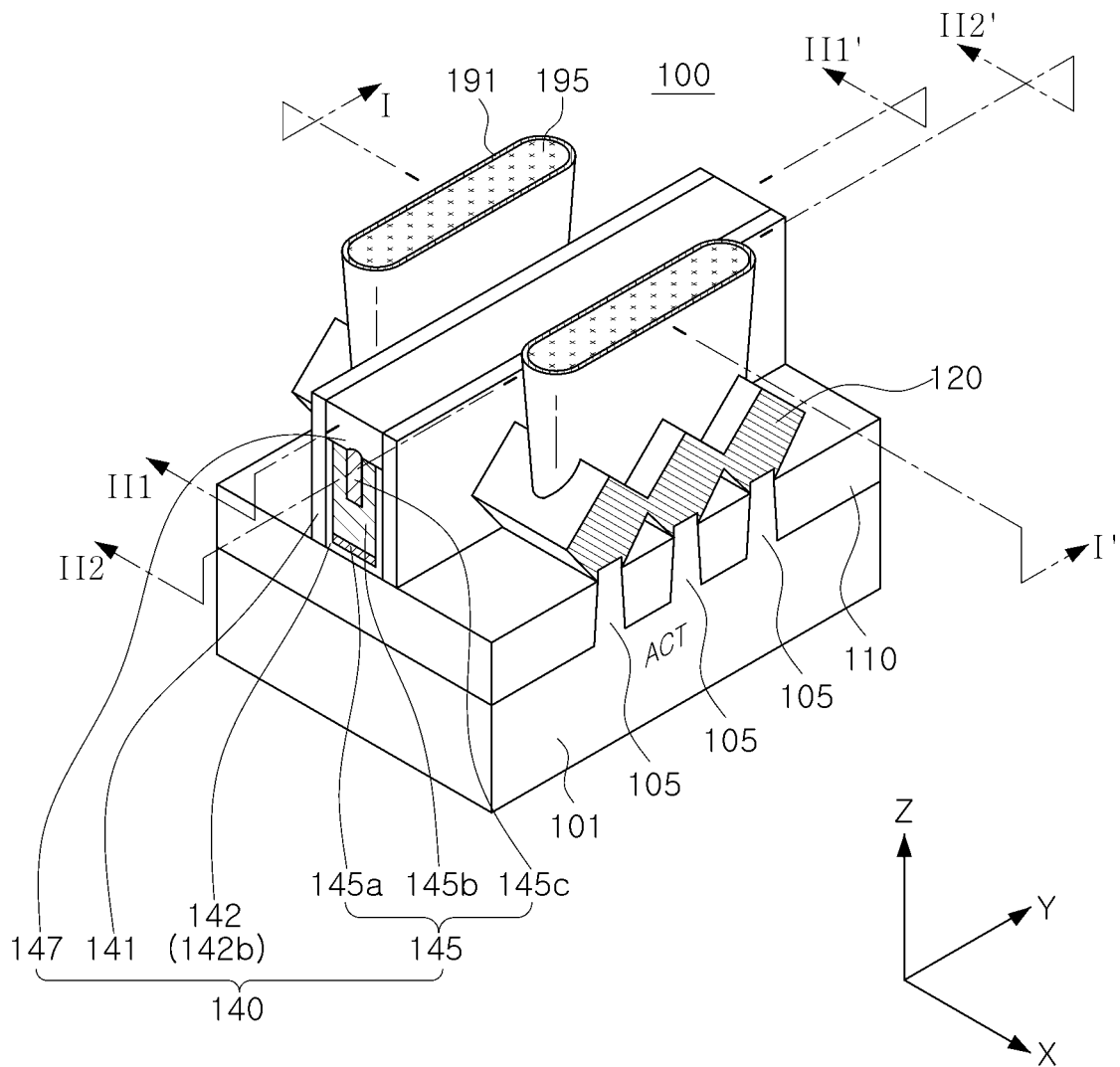
FIG. 1 is a perspective view illustrating a semiconductor device according to an embodiment of the present inventive concept.
Figure 2A:
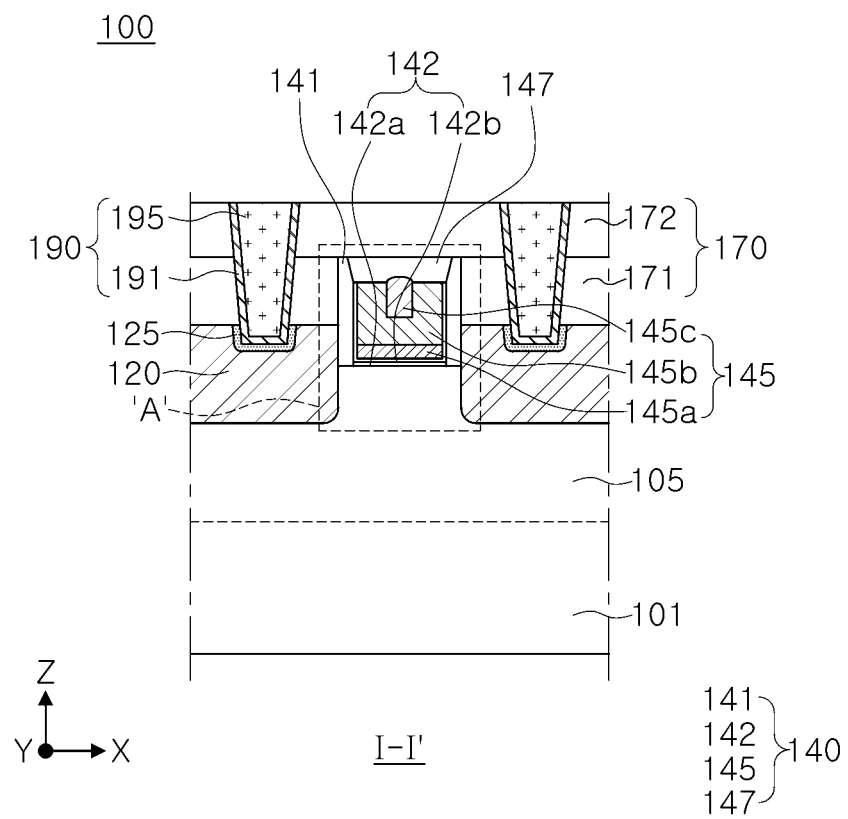
FIGS. 2A, 2B and 2C are cross-sectional views illustrating the semiconductor device of FIG. 1, taken along lines I-I', II1-II1', and II2-II2', respectively.
Figure 2B:
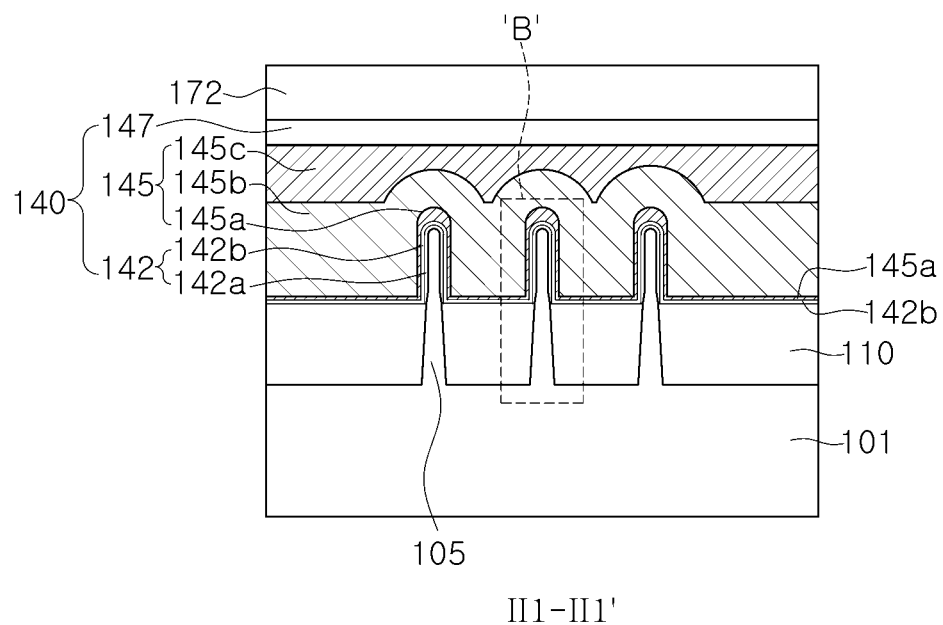
Figure 2C:
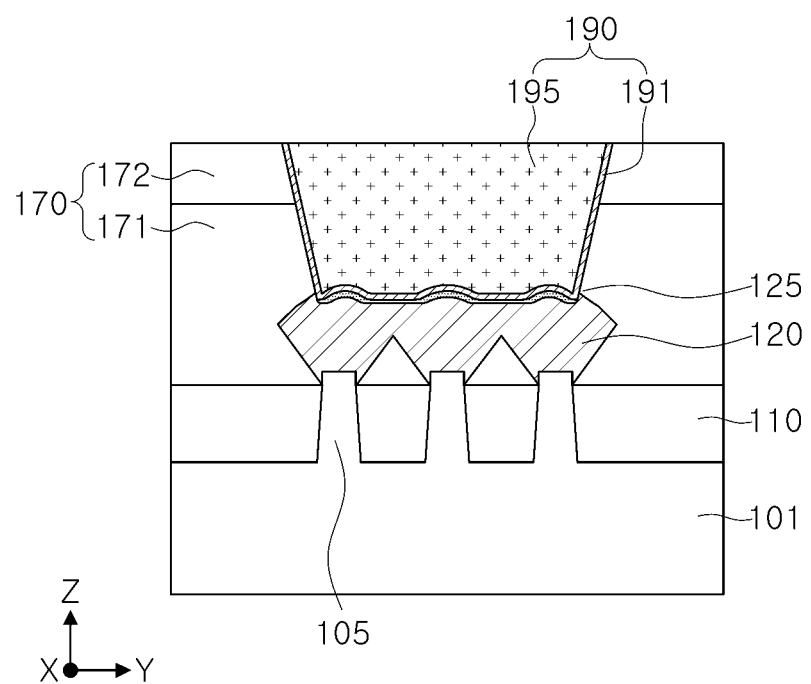

FIG. 1 is a perspective view illustrating a semiconductor device according to an exemplary embodiment of the present inventive concept, and FIGS. 2A to 2C are cross-sectional views illustrating the semiconductor device of FIG. 1, taken along lines I-I', II1-II1', and II2-II2', respectively.

Referring to FIGS. 1, and 2A to 2C, a semiconductor device 100 according to an exemplary embodiment of the present inventive concept may include a substrate 101 having an active region ACT, a plurality of active fins 105 extending in a first direction (e.g., an X-direction), parallel to an upper surface of the active region ACT, and a gate structure 140 disposed on the plurality of active fins 105 and extending in a second direction (e.g., a Y-direction), different from the first direction. For reference, FIG. 1 illustrates that an interlayer insulating portion 170 is omitted to illustrate an arrangement of a source/drain region 120 and the gate structure 140 in more detail.

The substrate 101 may include, for example, a group IV semiconductor such as Si or Ge, a group IV-IV compound semiconductor such as SiGe or SiC, or a group III-V compound semiconductor such as GaAs, InAs, or InP. The substrate 101 may include the active region ACT. The active region ACT may be a conductive region such as a well doped with impurities or a structure doped with impurities. For example, the active region ACT may be an N-type well for a NMOS transistor or a P-type well for an PMOS transistor.

A device isolation film 110 may form the active region ACT and the active fins 105. For example, the device isolation film 110 may include an insulating material such as silicon oxide. The device isolation film 110 may include a first isolation region forming the active region ACT and a second isolation region (see FIG. 1) forming the active fins 105. For example, the first isolation region may have a bottom surface lower than that of the second isolation region. For example, the first isolation region may be also referred to as deep trench isolation (DTI), and the second isolation region may be also referred to as shallow trench isolation (STI). The second isolation region may be disposed on the active region ACT.

As described above, the plurality of active fins 105 may be disposed on the upper surface of the active region ACT. The plurality of active fins 105 may have a structure protruding from the upper surface of the active region ACT in a third direction (e.g., a Z-direction), substantially perpendicular to the first and second directions. In this embodiment, three active fins 105 are illustrated, but the present inventive concept is not limited thereto. For example, there may be one or more (e.g., two, four or more) of the active fins 105. Referring to FIGS. 1, 2B and 2C, three (3) active fins 105 may be arranged on the active region ACT in the second direction (e.g., the Y-direction), and may extend in the first direction (e.g., the X-direction), respectively. For example, the active fins 105 may be arranged side by side.

As illustrated in FIG. 1, the gate structure 140 may extend in the second direction (the Y-direction), intersecting the first direction (the X-direction). For example, the gate structure 140 may have a line structure. The gate structure 140 may be provided across some regions of the active fins 105.

Referring to FIGS. 1, 2A, and 2B, the gate structure 140 may include a pair of gate spacers 141, a gate insulating film 142 and a gate electrode 145. The pair of gate spacers 141 may be spaced apart from each other in the first direction and may extend in the second direction, and the gate insulating film 142 and the gate electrode 145 may be sequentially disposed in a space (also referred to as a "trench") between the gate spacers 141. In addition, the gate structure 140 may include a capping pattern 147 between the pair of gate spacers 141 and disposed on the gate electrode 145.

The gate spacers 141 may be formed on the device isolation film 110 while intersecting the plurality of active fins 105. The pair of gate spacers 141 may form a trench for the gate insulating film 142 and the gate electrode 145 in the first direction. The gate spacers 141 may extend along both sidewalls of the gate electrode 145. For example, the gate spacers 141 may include silicon oxide ($SiO_x$), silicon nitride ($SiN_x$), silicon oxynitride ($SiO_xN_y$), silicon carbonitride ($SiC_xN_y$), silicon oxycarbonitride ($SiO_xC_yN_z$), or combinations thereof. In an exemplary embodiment of the present inventive concept, the gate spacers 141 may include a plurality of layers formed of different materials. Each of the gate spacers 141 employed in this embodiment is illustrated to be provided as a single layer. However, the present inventive concept is not limited thereto. For example, the gate spacers 141 may include a plurality of spacer layers sequentially stacked on the sidewalls of the gate electrode 145 and having different dielectric constants.

The gate insulating film 142 may be interposed between the plurality of active fins 105 and the gate electrode 145. For example, the gate insulating film 142 may be formed along a lower surface of the gate electrode 145. For example, the gate insulating film 142 may be disposed along upper surfaces and lateral surfaces of the plurality of active fins 105, exposed from the device isolation film 110, as illustrated in FIG. 2B. In addition, the gate insulating film 142 may extend onto an upper surface of the device isolation film 110.

The gate insulating film 142 employed in this embodiment may include a first gate insulating film 142a and a second gate insulating film 142b. The first gate insulating film 142a may be referred to as an "interfacial film." The first gate insulating film 142a may be formed along the lateral surfaces and the upper surfaces of the active fins 105 (see FIG. 2B). For example, the first gate insulating film 142a may include silicon oxide. Depending on a material of the substrate 101, a material of the active fins 105 and/or a material of the second gate insulating film 142b, or the like, the first gate insulating film 142a may include a different material. In an exemplary embodiment of the present inventive concept, the first gate insulating film 142a may be omitted.

The second gate insulating film 142b may be disposed between the first gate insulating film 142a and the gate electrode 145 (also referred to as a "first portion"). The second gate insulating film 142b may have extended portions (also referred to as a "second portion") extending between the pair of gate spacers 141 and the gate electrode 145 (for example, a second gate electrode 145b). For example, the second gate insulating film 142b may have a U shape in the cross-sectional view illustrated in FIG. 2A. For example, the second gate insulating film 142b may have a square shape with an open side. In an exemplary embodiment of the present inventive concept, the second gate insulating film 142b may cross the plurality of active fins 105, and may extend along the upper surface of the device isolation film 110 in the second direction. The second gate insulating film 142b may include a high-k material. For example, the second gate insulating film 142b may include hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or combinations thereof.

The gate electrode 145 employed in this embodiment may include a first gate electrode 145a and a second gate electrode 145b disposed on the first gate electrode 145a. For example, the first gate electrode 145a and the second gate electrode 145b may be disposed along the upper and lateral surfaces of the plurality of active fins 105. In an exemplary embodiment of the present inventive concept, unlike the second gate electrode 145b, the first gate electrode 145a may not extend along inner sidewalls of the gate spacers 141 (see FIG. 2A). Further, the first and second gate electrodes 145a and 145b may be disposed on the second gate insulating film 142b, and may extend in the second direction to overlap the device isolation film 110 (see FIG. 2B).

Figure 3A:
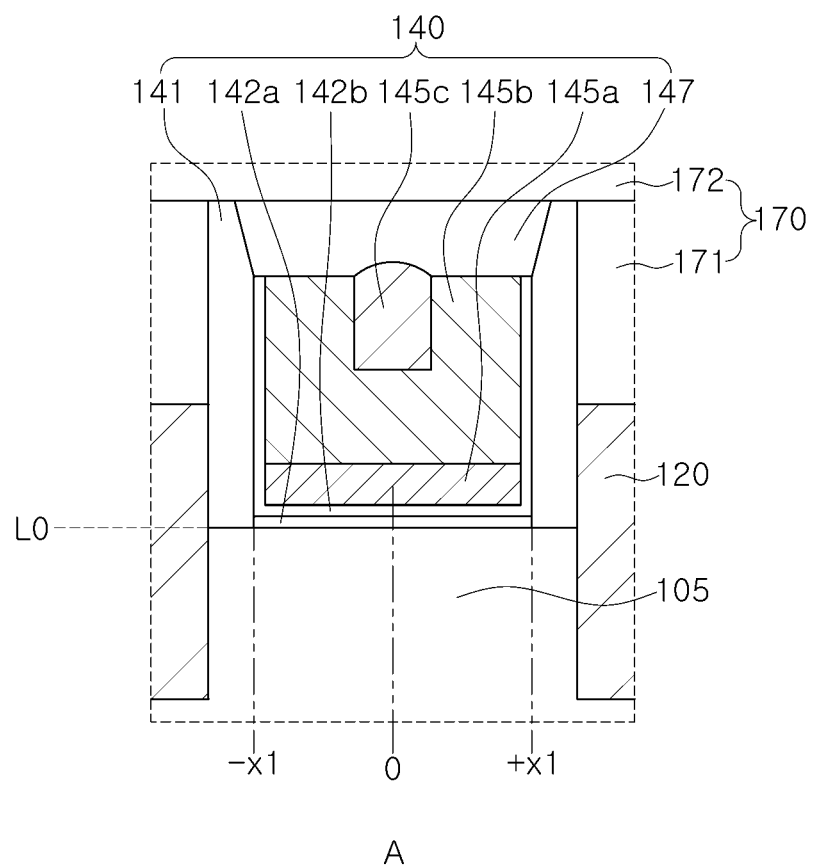
FIGS. 3A and 3B are partially enlarged views illustrating portions "A" and "B" of the semiconductor device of FIGS. 2A and 2B, respectively.
Figure 3B:
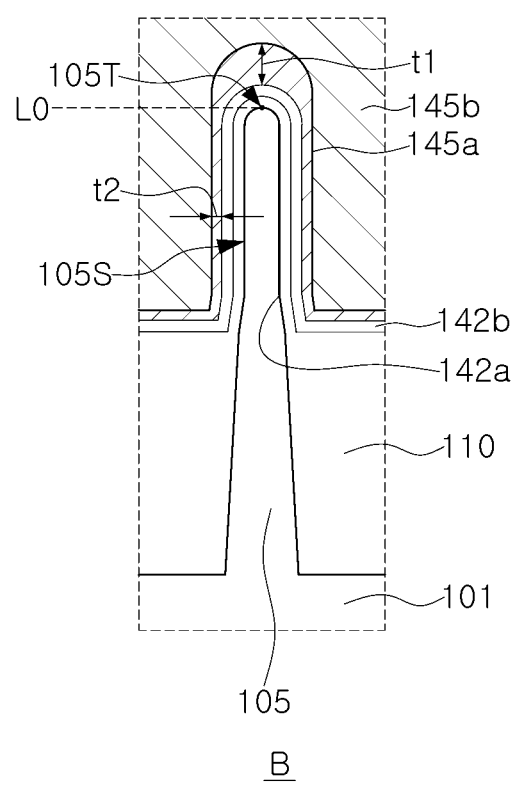

The gate electrode 145 employed in this embodiment will be described in more detail with reference to FIGS. 3A and 3B. FIGS. 3A and 3B are partially enlarged views illustrating portions "A" and "B" of the semiconductor device of FIGS. 2A and 2B, respectively, and a level corresponding to upper surfaces 105T of the active fins may be indicated as "L0."

First, referring to FIGS. 2A and 3A, the first gate electrode 145a may have linearity while being disposed along a bottom portion (e.g., the first portion) of the second gate insulating film 142b, and the second gate electrode 145b may have a U shape having a portion disposed on the first gate electrode 145a (also referred to as, e.g., a "third portion") and a portion extending along the second portion of the second gate insulating film 142b (also referred to as, e.g., a "fourth portion").

As such, in this embodiment, the first gate electrode 145a may not be present between the second gate electrode 145b and the gate spacers 141. The second gate electrode 145b may be in direct contact with the extended portions (e.g., the second portion) of the second gate insulating film 142b. For example, the extended portions may extend from the bottom portion of the second gate insulating film 142b.

In an exemplary embodiment of the present inventive concept, the second gate electrode 145b may include a material having a work function greater than that of the first gate electrode 145a. For example, the first gate electrode 145a may include TiN, TaN, W, WCN, or combinations thereof, and the second gate electrode 145b may include TiAl, TiAlC, TiAlN, or combinations thereof.

As illustrated in FIG. 3A, unlike the U-shaped second gate electrode 145b, the first gate electrode 145a may be implemented with linearity, to reduce deviations in distance between the second gate electrode 145b and the active fin 105 along the X-direction. Unlike this embodiment, when the first gate electrode 145a is implemented in a U-shape, a difference of a distance between the second gate electrode 145b and the active fin 105 at edges (−x1, +x1) and a distance between the second gate electrode 145b and the active fin 105 at a center (0) may increase. In contrast, in this embodiment, the first gate electrode 145a having linearity may reduce such a difference.

Figure 4:
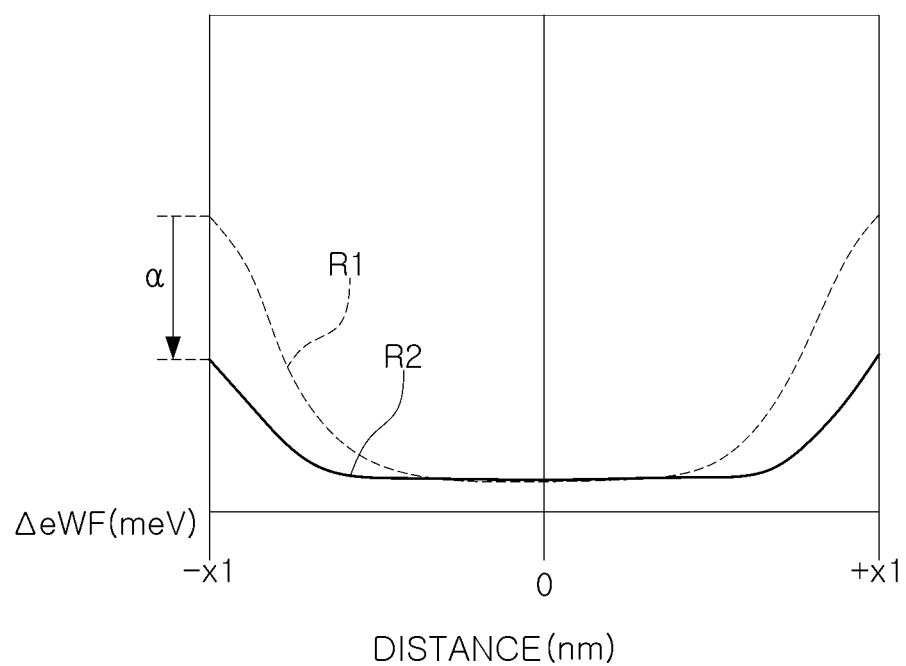
FIG. 4 is a graph illustrating a change in work function of the embodiment of FIG. 3A.

As a result, since a diffusion distance of a dopant (e.g., Al) of the second gate electrode 145b into the first gate electrode 145a also decreases the deviation at the edges and the center, as illustrated in FIG. 4, a work function delta in the X-direction may be reduced to increase gate controllability. A graph indicated by R1 represents delta values of work functions when the first gate electrode 145a has a U-shaped shape, and a graph indicated by R2 represents delta values of work functions when the first gate electrode 145a has linearity according to an exemplary embodiment of the present inventive concept. It can be seen that the deviation may be reduced by decreasing by a at the edges (−x1, +x1) of the gate electrode. Additionally, when the first gate electrode 145a according to this embodiment is adopted, a space to be filled by a gap fill electrode 145c may be secured to reduce a gap fill margin.

The first gate electrode 145a having linearity, illustrated in the cross-sectional views of FIGS. 2A and 3A, may suppress or hinder growth of the inner sidewalls of the gate spacers 141, and may be formed using surfaces of the plurality of active fins 105 (for example, various processes (refer to FIGS. 7A to 10D) selectively growing on the upper surface 105T).

Referring to FIG. 3B, the first gate electrode 145a may be formed on the upper surface 105T and a lateral surface 105S of the active fin 105, similar to the first and second gate insulating films 142a and 142b. In this embodiment, unlike the first and second gate insulating films 142a and 142b formed to be relatively conformal, a thickness t1 of a portion of the first gate electrode 145a located on the upper surface 105T of the active fin 105 may be greater than a thickness t2 of a portion of the first gate electrode 145a located on the lateral surface 105S of the active fin 105.

The gate electrode 145 employed in this embodiment may further include the gap fill electrode 145c filled in a space between the extended portions of the second gate electrode 142b. In addition, the capping pattern 147 may be disposed on the second gate electrode 145b and the gap fill electrode 145c, and may fill the trench. The capping pattern 147 may have an upper surface, substantially coplanar with an upper surface of an inter-gate insulating film 171 and upper surfaces of the gate spacers 141. The gap fill electrode 145c may be partially removed in a process of forming the capping pattern 147. In an exemplary embodiment of the present inventive concept, the gap fill electrode 145c may not be visible in the cross-sectional views illustrated in FIGS. 2A and 3B. In an exemplary embodiment of the present inventive concept, the gap fill electrode 145c may not be introduced when there is little space between the extended portions of the second gate electrode 145b. For example, the gap fill electrode 145c may include tungsten (W), alloys thereof, or compounds thereof. For example, the capping pattern 147 may include silicon nitride or silicon oxynitride.

The gate structure 140 may be formed through, for example, a replacement process (refer to processes of FIGS. 5A to 5F), but the present inventive concept is not limited thereto.

The semiconductor device 100 according to an exemplary embodiment of the present inventive concept may include source/drain regions 120 disposed in regions of active fins 105 located on both sides of the gate structure 140.

The source/drain regions 120 may be formed in recessed regions of the active fins 105. The source/drain regions 120 may include an epitaxial layer obtained in the recessed region of the active fin 105 by selective epitaxial growth (SEG), respectively. In an exemplary embodiment of the present inventive concept, the source/drain regions 120 may be provided as epitaxial layers in which epitaxial regrown from each of three (3) active fins 105 are merged with each other. The source/drain regions 120 may include, for example, Si, SiGe, or Ge, and the source/drain regions 120 may have different materials or shapes from each other, depending on an N-type or P-type transistor (e.g., P-type MOSFET).

The semiconductor device 100 according to this embodiment may be a P-type transistor, and the source/drain regions 120 may include, for example, silicon-germanium (SiGe), and may be doped with P-type impurities (e.g., boron (B), indium (In), and gallium (Ga)). A cross-sectional view (e.g., a Y-Z plane, see FIG. 2C) of the source/drain regions 120 may be pentagonal. In a case of an N-type transistor, the source/drain regions 120 may include, for example, silicon, and may be doped with N-type impurities (e.g., phosphorus (P), nitrogen (N), arsenic (As), and antimony (Sb)). A cross-sectional view (e.g., a Y-Z plane, see FIG. 2C) of the source/drain regions 120 may be hexagonal or polygonal having a gentle angle.

In this manner, the source/drain regions 120 may constitute a 3D semiconductor device such as a Fin-FET together with the active fins 105 and the gate structure 140.

The semiconductor device 100 according to this embodiment may include a contact structure 190 passing through the interlayer insulating portion 170 and connected to the source/drain regions 120. Similar to the contact structure 190, an additional contact structure passing through the interlayer insulating portion 170 and connected to the gate electrode 145 of the gate structure 140 may be included.

The interlayer insulating portion 170 may include an inter-gate insulating film 171 and a capping insulating film 172, sequentially disposed on the source/drain regions 120. The inter-gate insulating film 171 may be disposed between adjacent gate structures 140, and may cover the source/drain regions 120 and the device isolation film 110. As described above, the inter-gate insulating film 171 may have an upper surface substantially coplanar with an upper surface of the gate spacer 141 and an upper surface of the capping pattern 147. For example, at least one of the inter-gate insulating film 171 and the capping insulating film 172 may include silicon nitride, silicon oxide, or silicon oxynitride. In an exemplary embodiment of the present inventive concept, the inter-gate insulating film 171 may be a tetra ethyl ortho silicate (TEOS), an undoped silicate glass (USG), a phosphosilicate glass (PSG), a borosilicate glass (BSG), a boro-phosphosilicate glass (BPSG), a fluoride silicate glass (FSG), a spin on glass (SOG), a tonen silazene (TOSZ), or combinations thereof. At least one of the inter-gate insulating film 171 and the capping insulating film 172 may be formed using a chemical vapor deposition (CVD) or spin coating process.

In this embodiment, the contact structure 190 may include a conductive barrier 191 and a contact plug 195 disposed on the conductive barrier 191. As described above, the contact structure 190 may be formed in a region in which a portion of the source/drain region 120 is recessed. A metal silicide layer 125 may be formed in the recessed portion of the source/drain region 120. For example, the metal silicide layer 125 may be disposed between the contact structure 190 and the source/drain region 120, to improve contact resistance with the source/drain region 120. For example, the metal silicide layer 125 may contact the contact structure 190 and the source/drain region 120. For example, the metal silicide layer 125 may be formed of a material such as CoSi, NiSi, TiSi, NiPtSi, and/or NiTiSi. In an exemplary embodiment of the present inventive concept, the conductive barrier 191 may be a conductive metal nitride film. For example, the conductive barrier 191 may include TiN, TaN, AlN, WN, and combinations thereof. The contact plug 195 may include, for example, tungsten (W), cobalt (Co), titanium (Ti), alloys thereof, or combinations thereof.

FIGS. 5A to 5F are perspective views illustrating a method of manufacturing a semiconductor device according to an exemplary embodiment of the present inventive concept. A manufacturing method according to this embodiment can be understood as a manufacturing method of the semiconductor device 100 illustrated in FIG. 1.

Figure 5A:
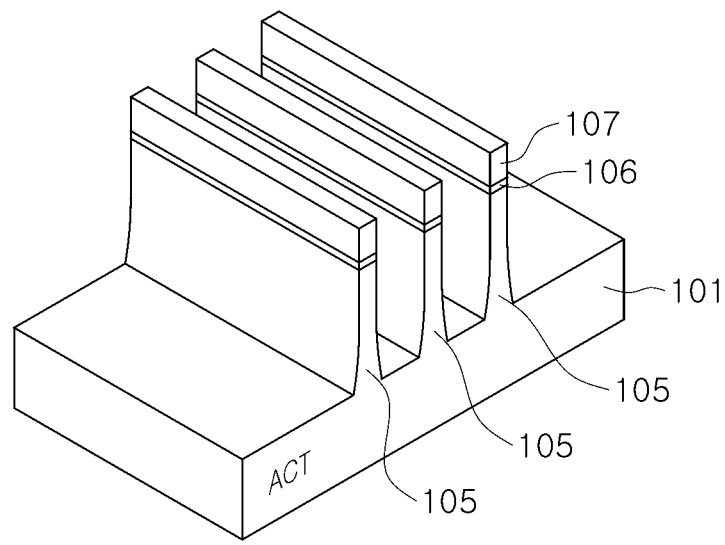
FIGS. 5A, 5B, 5C, 5D, 5E and 5F are perspective views illustrating a method of manufacturing a semiconductor device according to an exemplary embodiment of the present inventive concept.

Referring to FIG. 5A, a plurality of active fins 105 may be formed in an active region ACT on the substrate 101.

The substrate 101 may include the active region ACT. In this embodiment, the active region ACT may be a p-type impurity region or an n-type impurity region. Each of the plurality of active fins 105 may extend in the first direction (the X-direction), and may be arranged in the second direction (the Y-direction), substantially perpendicular to the first direction. The plurality of active fins 105 may be formed by using an anisotropic etching process using a pad oxide pattern 106 and a mask pattern 107. For example, the anisotropic etching process may use a double patterning technology (DPT) or a quadruple patterning technology (QPT).

Figure 5B:
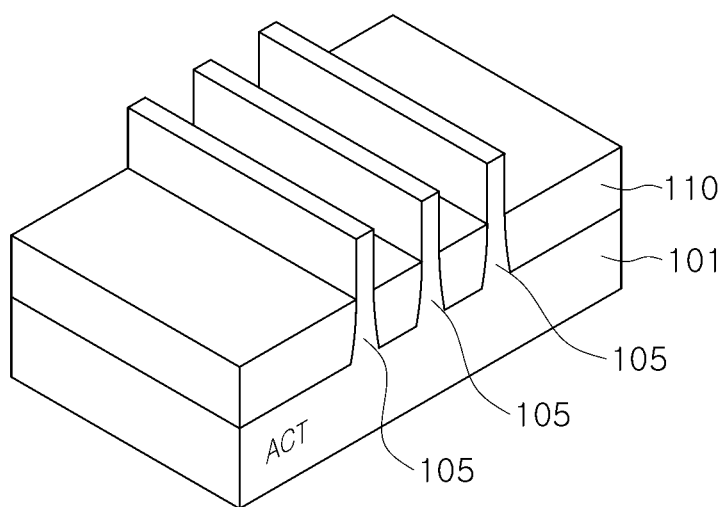

Next, referring to FIG. 5B, a device isolation film 110 may be formed on the active region ACT to partially fill the plurality of active fins 105, respectively.

After the device isolation film 110 is formed of an insulating material to cover the plurality of active fins 105, a planarization process may be performed on the insulating material. During the planarization process, the pad oxide pattern 106 and the mask pattern 107 may be removed together. After the planarization process, the plurality of active fins 105 may protrude from the device isolation film 110 by etch-backing the insulating material of the device isolation film 110 filling a space between the plurality of active fins 105. For example, the device isolation film 110 may be EOS, USG, PSG, BSG, BPSG, FSG, SOG, TOSZ, or combinations thereof.

Figure 5C:
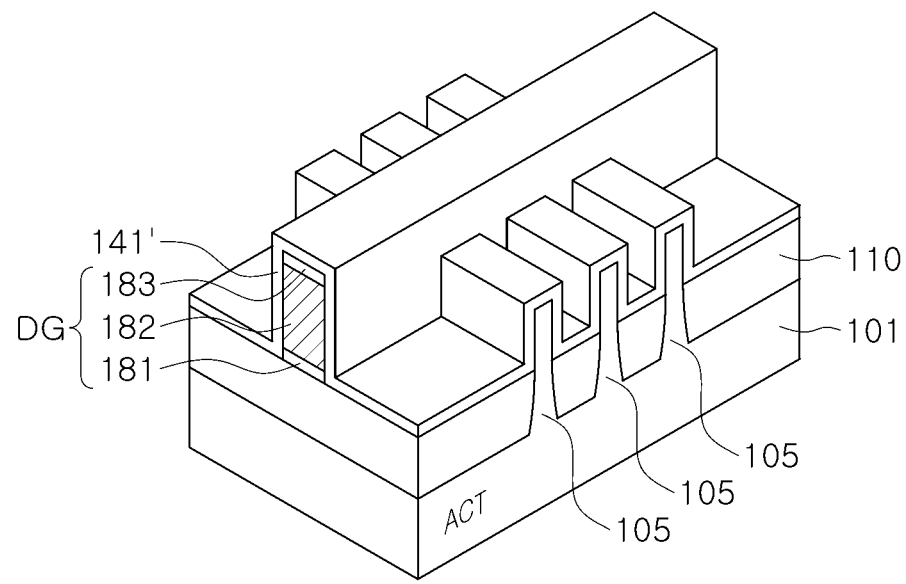

Next, referring to FIG. 5C, a dummy gate structure DG and an insulating spacer film 141' for a gate spacer may be formed.

The dummy gate structure DG may extend in the second direction (e.g., the Y-axis direction) to cross the active fins 105. The dummy gate structure DG may include a dummy gate insulating film 181, a dummy gate electrode 182, and a mask pattern layer 183. The dummy gate insulating film 181 and the dummy gate electrode 182 may be formed by an etching process using the mask pattern layer 183. For example, the dummy gate insulating film 181 may be formed of silicon oxide, and the dummy gate electrode 182 may be formed of polysilicon. For example, the insulating spacer film 141' may include silicon nitride (SiN$_x$), silicon oxynitride (SiO$_x$N$_y$), silicon carbonitride (SiC$_x$N$_y$), silicon oxycarbonitride (SiO$_x$C$_y$N$_z$), or combinations thereof.

Figure 5D:
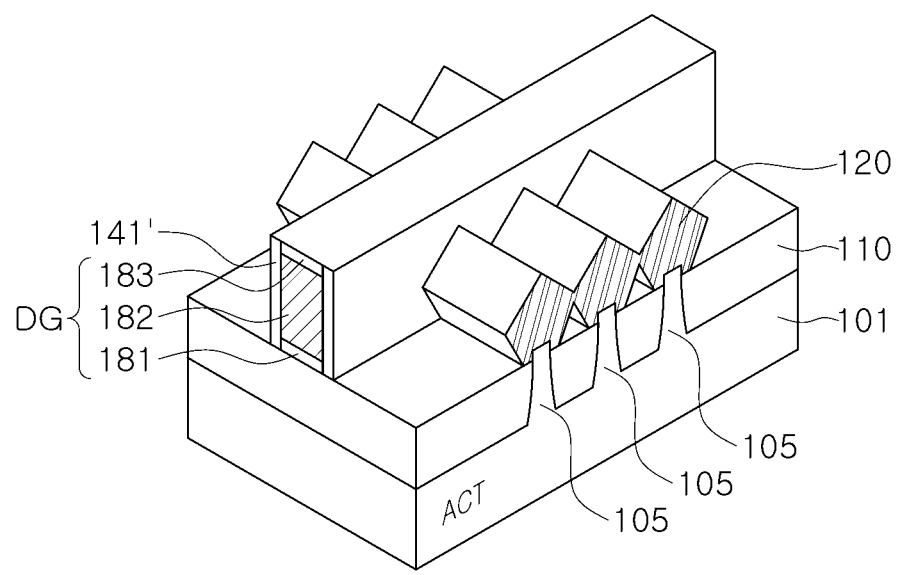

Next, referring to FIG. 5D, after etching to recess the plurality of active fins 105 located in the active region ACT, a source/drain region 120 may be formed on the recessed upper surfaces of the plurality of active fins 105.

Prior to this process, the insulating spacer film 141' may be etched by an anisotropic etching process to form a pair of gate spacers 141 extending in the second direction (e.g., the Y-direction). The recessed upper surfaces of the plurality of active fins 105 may be slightly higher than the upper surfaces of the device isolation layer 150. The source/drain region 120 may be formed from the recessed upper surfaces using selective epitaxial growth (SEG). For example, the source/drain region 120 may include a silicon-germanium (SiGe) epitaxial. In an exemplary embodiment of the present inventive concept, the silicon-germanium (SiGe) epitaxial may generate compressive stress in the active fins 105, formed of silicon (Si), to increase electrical characteristics. In this embodiment, the p-type impurity may be doped in-situ into the source/drain region 120 or doped with a separate ion implantation process. For example, the p-type impurity may be boron (B), indium (In), and/or gallium (Ga).

Figure 5E:
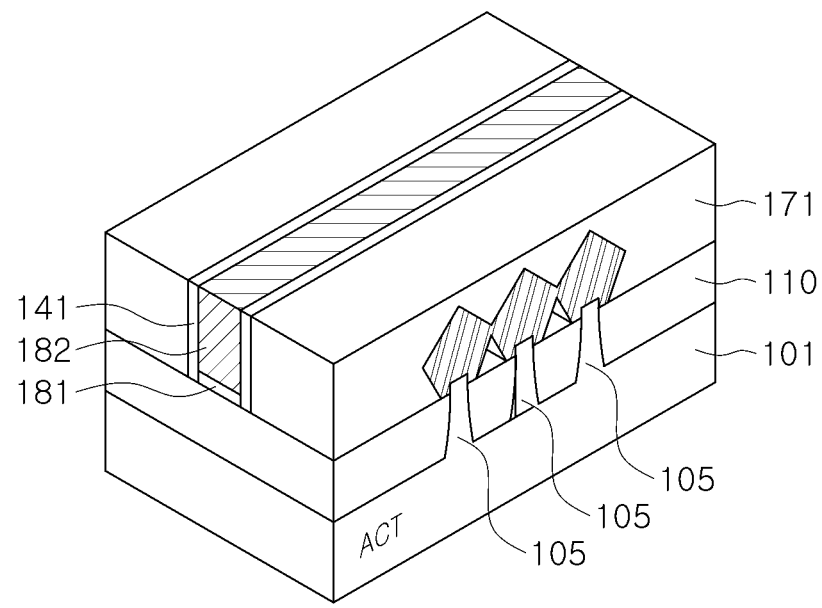

Next, referring to FIG. 5E, an inter-gate insulating film 171 may be formed to at least partially cover the dummy gate structure DG and the source/drain region 120, and a planarization process may be applied to expose the dummy gate electrode 182.

The inter-gate insulating film 171 may include, for example, at least one of silicon oxide, silicon nitride, and/or silicon oxynitride. The inter-gate insulating film 171 may be formed on the substrate 101 to cover the dummy gate structure DG and the source/drain region 120, and the inter-gate insulating film 171 and the dummy gate structure DG may be planarized to expose an upper surface of the dummy gate electrode 182.

Figure 5F:
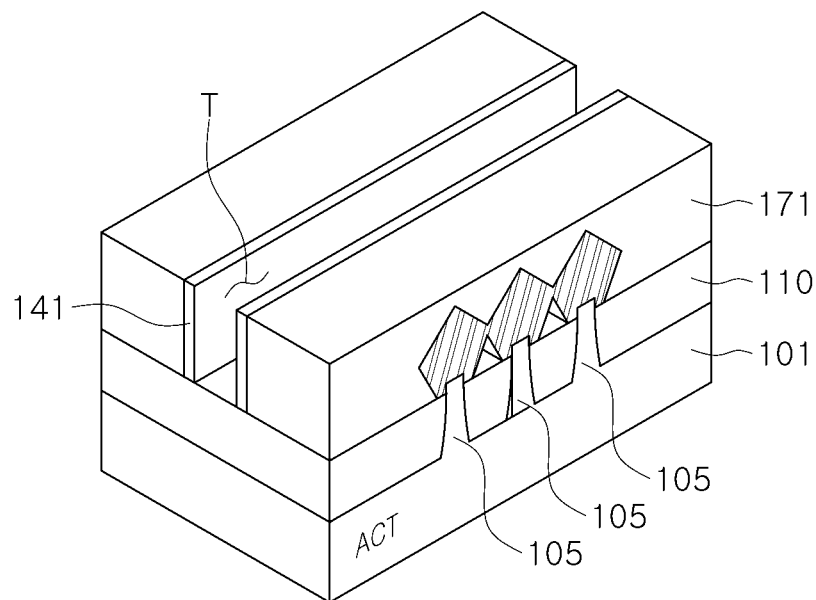

Next, referring to FIG. 5F, the dummy gate electrode 182 and the dummy gate insulating film 181 may be removed to form a trench T.

The trench T may be a space for forming a gate insulating film and a gate electrode, and may be defined by a spaced distance between the pair of gate spacers 141 as described above. Active fins 105, not recessed, may remain in the trench T (see FIG. 2B).

FIGS. 6A to 6D are cross-sectional views illustrating a process of forming a gate structure in detail, subsequent to FIG. 5F, and can be understood as being enlarged views of cross-sectional regions (the portions "A" and "B") corresponding to FIGS. 3A and 3B.

Figure 6A:
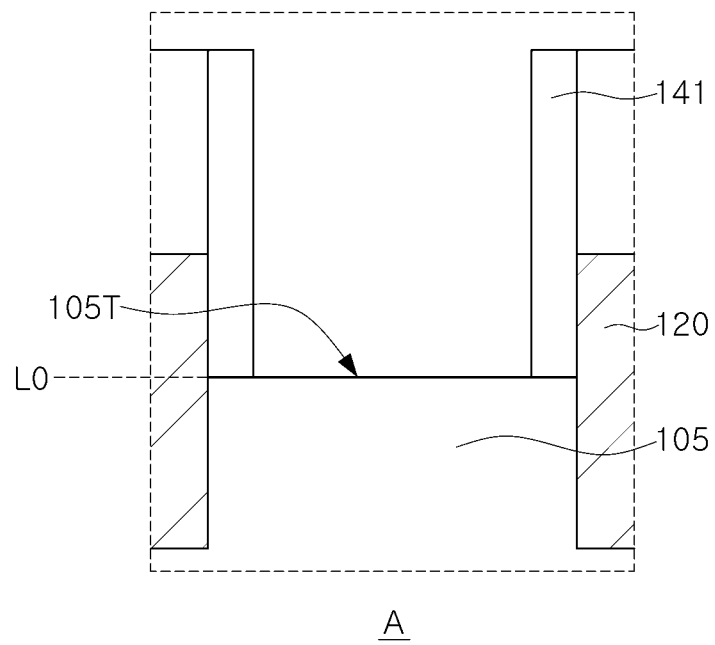
FIGS. 6A, 6B, 6C and 6D are cross-sectional views of each process, illustrating a process of forming a gate structure, subsequent to FIG. 5F.
Figure 6A:
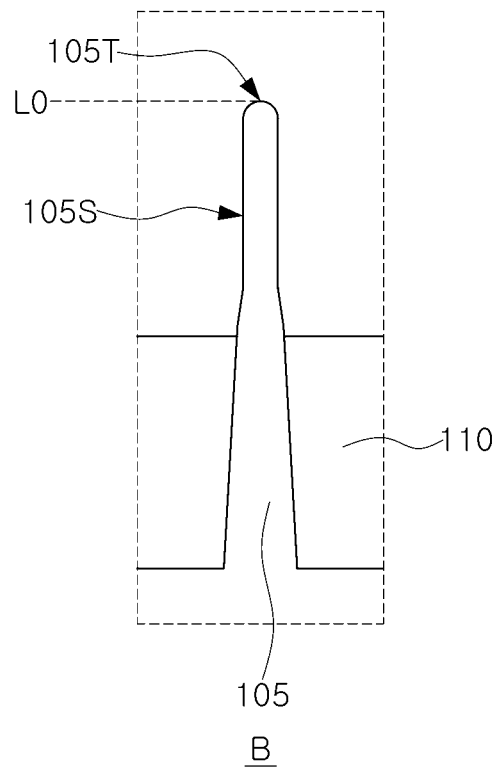

Referring to FIG. 6A, cross-sectional regions of portions A and B of the result according to the process of FIG. 5F are illustrated, respectively. As described above, a gate spacer 141 may define the trench T, which is the space obtained by removing the dummy gate electrode 182 and the dummy gate insulating film 181. The portions A and B may correspond to cross-sectional regions of FIG. 1, taken along line I-I' (e.g., in the X-direction) and line III1-III1' (e.g., in the Y-direction). A relationship between the two cross-sectional regions (the portions "A" and "B") may be expressed as a level of an upper surface 105T of an active fin 105 indicated by "L0."

Figure 6B:
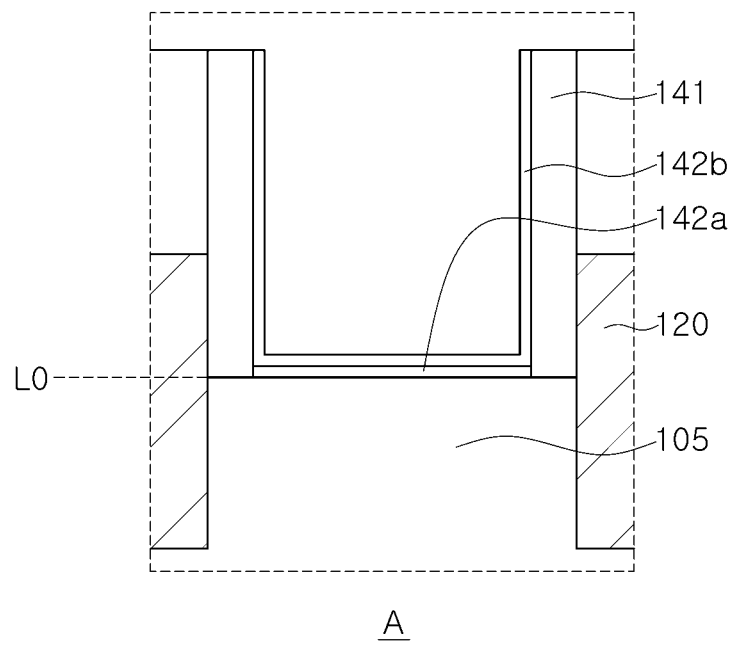
Figure 6B:
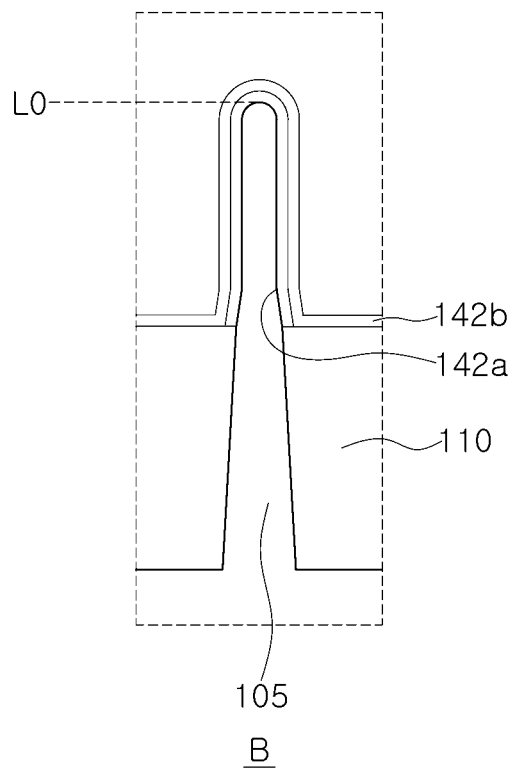

Next, referring to FIG. 6B, a first gate insulating film 142a and a second gate insulating film 142b may be formed in the trench T.

The first gate insulating film 142a may be formed by oxidizing an upper surface of the active fin 105. For example, the first gate insulating film 142a may include silicon oxide. Depending on materials (e.g., constituent elements) of a substrate 101, the active fin 105, and/or the second gate insulating film 142b, the first gate insulating film 142a may include a different material. In an exemplary embodiment of the present inventive concept, the first gate insulating film 142a may be omitted, and the second gate insulating film 142b may be disposed as a gate insulating film.

The second gate insulating film 142b may include a portion disposed on an upper surface of the first gate insulating film 142a (e.g., a first portion) and a portion extending from the first portion of the second gate insulating film 142b to be disposed on an inner sidewall of the gate spacer 141 (e.g., a second portion). In this embodiment, the second gate insulating film 142b may be conformally formed to have a U-shape in a cross-sectional view taken along line I-I' (e.g., the X-direction) in FIG. 1. For example, the second gate insulating film 142b may be conformally formed on the active fins 105. The second gate insulating film 142b may be formed by, for example, an ALD, CVD, or PVD process. The second gate insulating film 142b may include, for example, an oxide, a nitride, or a high-k material. In an exemplary embodiment of the present inventive concept, the second gate insulating film 142b may be formed in a multilayer structure.

Figure 6C:
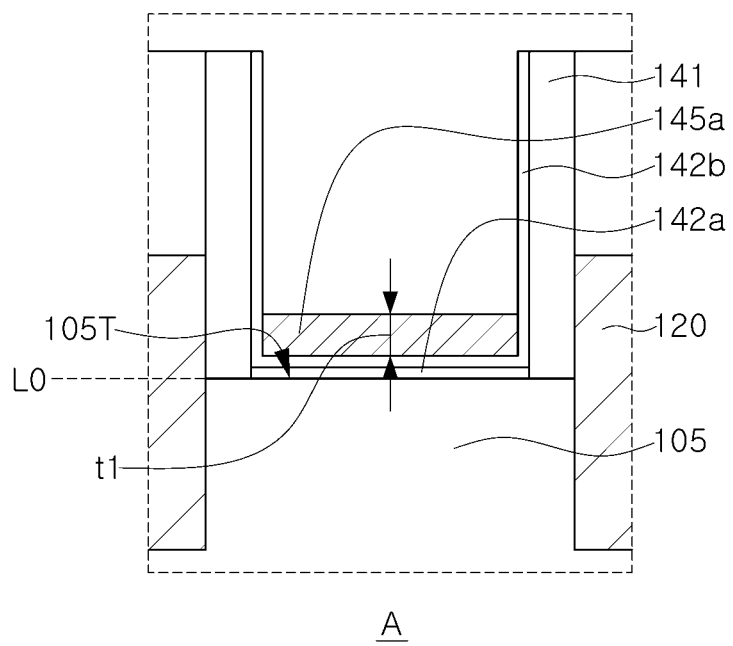
Figure 6C:
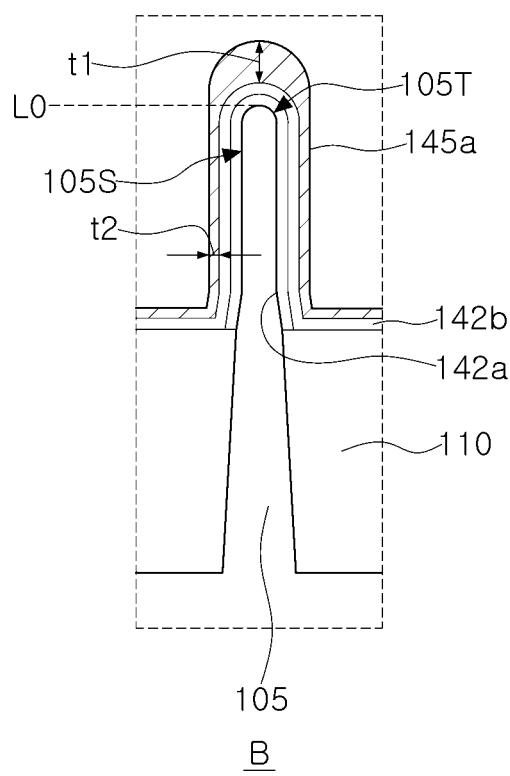

Next, referring to FIG. 6C, a first gate electrode 145a may be formed on the second gate insulating film 142b.

The first gate electrode 145a may be formed along upper and lateral surfaces of the active fin 105. The first gate electrode 145a may extend on the second gate insulating film 142b in the second direction, and may be disposed on an upper surface of the device isolation film 110 (see the portion "B"). For example, the first gate electrode 145a may include TiN, TaN, W, WCN, or combinations thereof.

In the portion "A" of FIG. 6C, the first gate electrode 145a may have linearity disposed along the first portion of the second gate insulating film 142b. For example, the first electrode 145a may be formed on a portion of the second portion of the second gate insulating film 142b. For example, using a PVD process having high linearity, the first gate electrode 145a may be formed only on a bottom surface of the trench T and not along the inner sidewall of the gate spacer 141. In an exemplary embodiment of the present inventive concept, a first gate electrode having a desired shape may be formed by applying a deposition process inclined to an upper surface of the substrate. An example of such an inclined deposition process may be illustrated in FIGS. 7A and 7B.

Figure 7A:
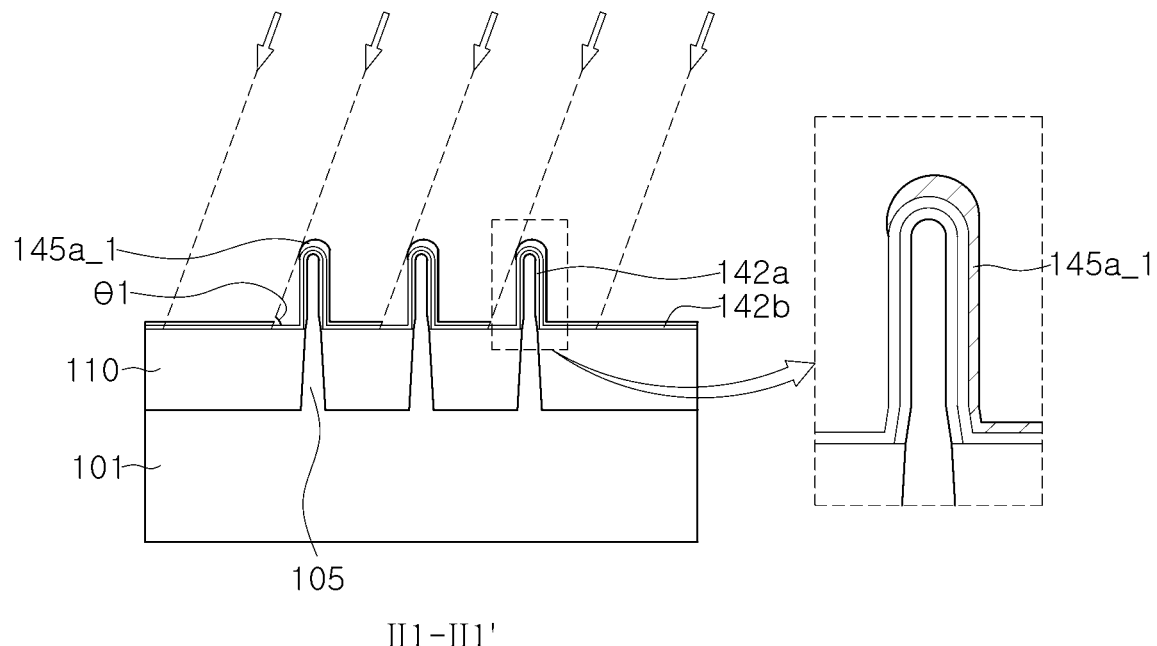
FIGS. 7A and 7B are cross-sectional views of each process for illustrating a method of manufacturing a semiconductor device according to an exemplary embodiment of the present inventive concept.

Referring to FIG. 7A, a first deposition process may be performed on an upper surface of a substrate 101 and the active fins 105 at a first angle θ1 with respect to the upper surface of the substrate 101 in the second direction (e.g., the Y-direction), intersecting the first direction (e.g., the X-direction). In addition, as an example, the first deposition process may be performed on the upper surface of the substrate 101 and the active fins 105 while the upper surface of a substrate 101 is inclined at the first angle θ1 in the second direction (e.g., the Y-direction), intersecting the first direction (e.g., the X-direction). In this first deposition process, a first electrode film 145a_1 may be formed on upper surfaces and one lateral surfaces of the active fins 105.

In addition, the first electrode film 145a_1 may be formed on a portion of an upper surface of a device isolation film 110. The first angle θ1 may be appropriately set in consideration of pitches of the active fins 105. For example, the first angle θ1 may range from about 70° to about 80° with respect to the upper surface of the substrate 101.

Subsequently, referring to FIG. 7B, a second deposition process may be performed on an upper surface of a substrate 101 and the active fins 105 at a second angle θ2 with respect to the upper surface of the substrate 101 in the second direction (e.g., the Y-direction). In addition, as an example, the second deposition process may be performed on the upper surface of the substrate 101 and the active fins 105 while the upper surface of the substrate 101 is inclined at the second angle θ2, corresponding to the first angle θ1 in the second direction (e.g., the Y-direction). For example, the second angle θ2 may range from about −70° to about −80° with respect to the upper surface of the substrate 101.

In this second deposition process, a second electrode film 145a_2 may be additionally formed on the upper surfaces of the active fins 105 together with other lateral surfaces of the active fins 105, which were not formed thereon during the first deposition process. A first gate electrode 145a having a relatively large thickness may be obtained from upper surfaces 105T of the active fins 105 by the first and second deposition processes preformed on the upper surface 105T of the active fins 105, according to an exemplary embodiment of the present invention.

In addition, in the deposition process having linearity in the second direction (e.g., the Y-axis direction), the first gate electrode 145a may hardly be deposited on inner sidewalls of gate spacers 141 opposing in the first direction (e.g., the X-direction). As a result, the first gate electrode 145a having the structure illustrated in FIG. 6C may be obtained. For example, as illustrated in portion "B" of FIG. 6C, the first gate electrode 145a may be formed on lateral surfaces 105S of the active fins 105 to have a thickness thinner than that of the upper surfaces 105T of the active fin 105, but as illustrated in portion "A" in FIG. 6C, the first gate electrode 145a may not be formed on the inner sidewalls of the gate spacers 141.

The second electrode film 145a_2 may also be formed in a portion of the upper surface of the device isolation film 110. On the upper surface of the device isolation film 110, a second electrode film 145a_2 may be additionally formed not only in a region in which the second electrode film 145a_2 is not formed, but also in a region in which the second electrode film 145a_2 is formed. Therefore, a first gate electrode 145a, integrated, may be provided.

Figure 6D:
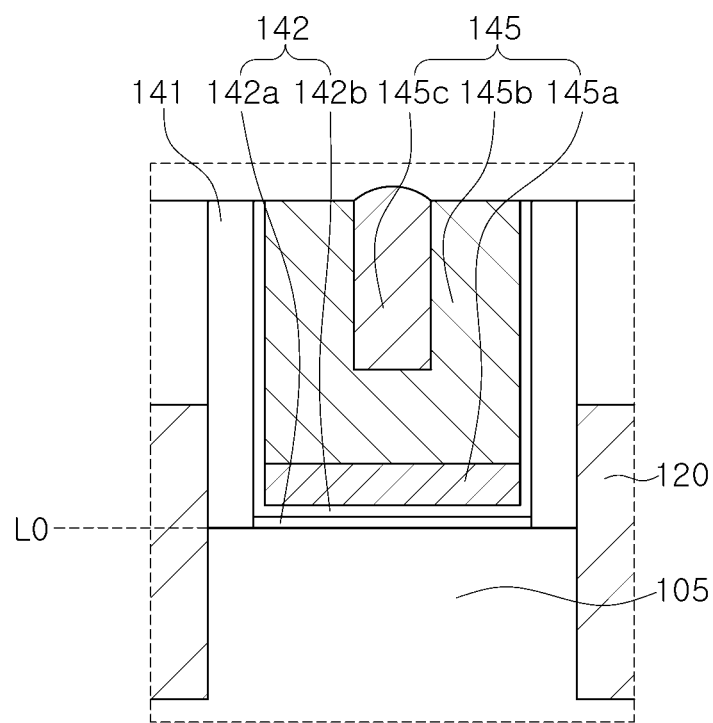
Figure 6D:
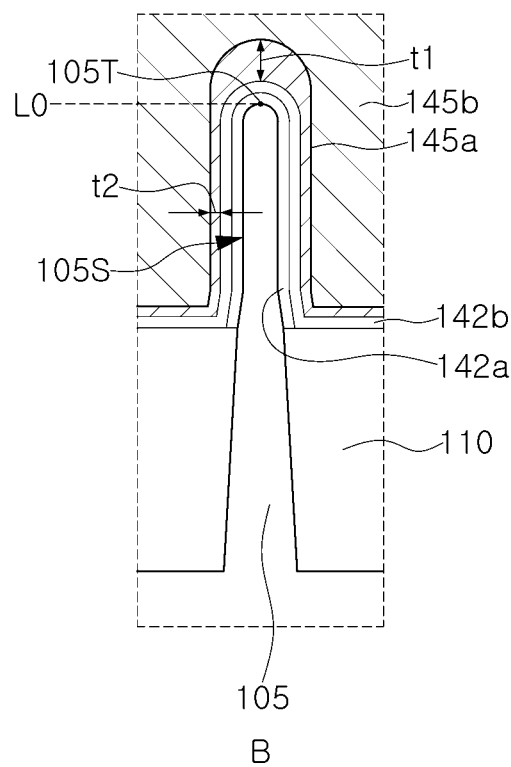

Referring to FIG. 6D, a second gate electrode 145b and a gap fill electrode 145c may be formed on the first gate electrode 145a.

The second gate electrode 145b may have a U-shape as illustrated in portion "A" of FIG. 6D. For example, the second gate electrode 145b may have a portion disposed on the first gate electrode 145a, and a portion extending therefrom and disposed along the second portion of the second gate insulating film 142b. For example, the second gate electrode 145b may be in direct contact with a portion disposed on the second gate insulating film 142b. The second gate electrode 145b may include a material having a work function greater than that of the second gate electrode 145b. For example, the second gate electrode 145b may include Al, TiAlC, TiAlN, or combinations thereof.

The gap fill electrode 145c may be filled in a space between extended portions of the second gate electrode 145b. For example, a space of the trench T remaining by the gap fill electrode 145c may be filled. For example, the gap fill electrode 145c may include tungsten (W), alloys thereof, or compounds thereof.

In a subsequent process, from the trench T, a portion of the second gate electrode 145b and a portion of the gap fill electrode 145c may be etched and removed, and an exposed portion of the second gate insulating film 142b may be removed, to form a capping pattern 147. Then, a planarization process may be applied to the capping pattern 147 to have an upper surface, substantially coplanar with an upper surface of the inter-gate insulating film 171 and upper surfaces of the gate spacers 141. For example, the capping pattern 147 may include silicon nitride or silicon oxynitride.

Figure 7B:
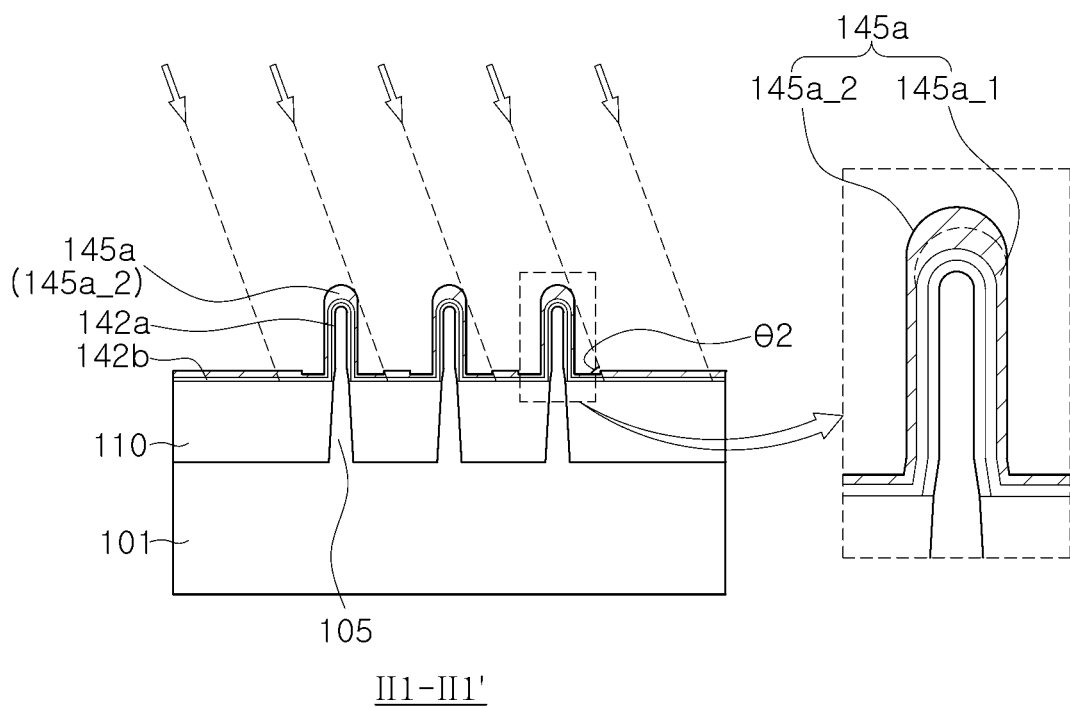

In addition to the processes of FIGS. 7A and 7B, a gate insulating film and/or a gate electrode may be formed to have various structures in the trench T by using other processes. As such a process, the processes of FIGS. 8A to 8D, 9A to 9D, and 10A to 10D may be used.

FIGS. 8A to 8D are cross-sectional views illustrating a method of manufacturing a semiconductor device according to an exemplary embodiment of the present inventive concept, using an inhibitor and/or plasma treatment for preventing deposition.

Figure 8A:
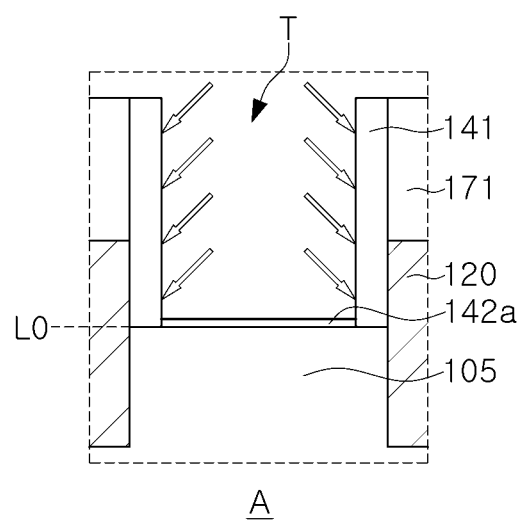
FIGS. 8A, 8B, 8C and 8D are cross-sectional views of each process for illustrating a method of manufacturing a semiconductor device according to an exemplary embodiment of the present inventive concept.

Referring to FIG. 8A, an inhibitor, having selectivity between a constituent material (e.g., SiN) of a gate spacer 141 and a constituent material (e.g., $SiO_2$) of a first gate insulating film 142a in a trench T, and/or a plasma treatment containing oxygen ($O_2$) may be applied. Deposition on an inner sidewall of the gate spacer 141 may be suppressed by the inhibitor having such selectivity and the plasma treatment. For example, the inhibitor may be an organic compound containing a CH group.

Figure 8C:
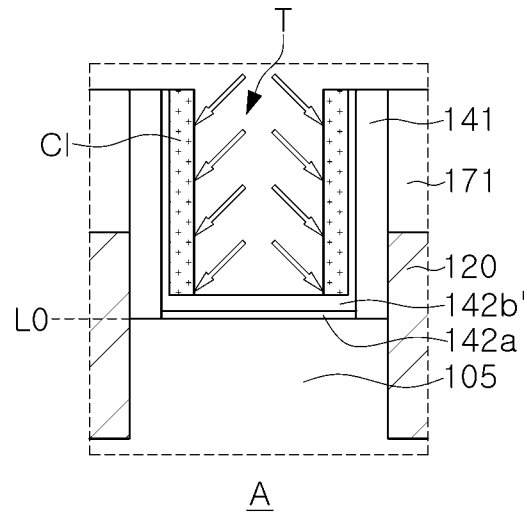
Figure 8B:
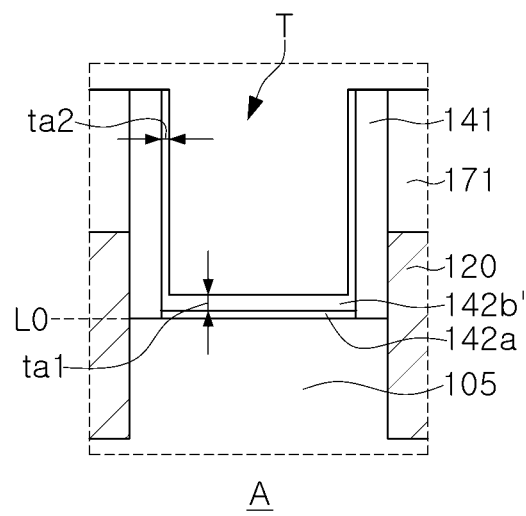

Next, referring to FIG. 8B, a second gate insulating film 142b' may be deposited on an inner surface of the treated trench T. While the second gate insulating film 142b' may be formed to have a thin thickness on the inner sidewall of the gate spacer 141, the second gate insulating film 142b' may be smoothly deposited on the first gate insulating film 142a. As a result, the second gate insulating film 142b' may be formed such that a thickness ta1 of a portion of the second gate insulating film 142b' disposed on the first gate insulating film 142a may be greater than a thickness ta2 of a portion of the second gate insulating film 142b' disposed on the inner sidewall of the gate spacer 141. In an exemplary embodiment of the present inventive concept, the thickness ta2 of the portion disposed on the inner sidewall of the gate spacer 141 may be about 50% or less of the thickness ta1 of the portion disposed on the first gate insulating film 142a. In an exemplary embodiment of the present inventive concept, the second gate insulating film 142b' may be hardly formed on the inner sidewall of the gate spacer 141.

Next, referring to FIG. 8C, a metal carbide layer CI may be formed on a portion of the second gate insulating film 142b' disposed on the inner sidewall of the gate spacer 141. An inhibitor having selectivity between a constituent material (e.g., AlC, WC, TiC, or SiC) of the metal carbide layer CI/a constituent material (e.g., a high-k oxide) of the second gate insulating film 142b', and/or a plasma treatment containing oxygen ($O_2$) may be applied. For example, the metal carbide layer CI illustrated in FIG. 8C may be obtained by depositing metal carbide on an entire surface of the second gate insulating film 142b', and removing selectively the metal carbide located on a bottom surface of the trench T by etching having high linearity.

Figure 8D:
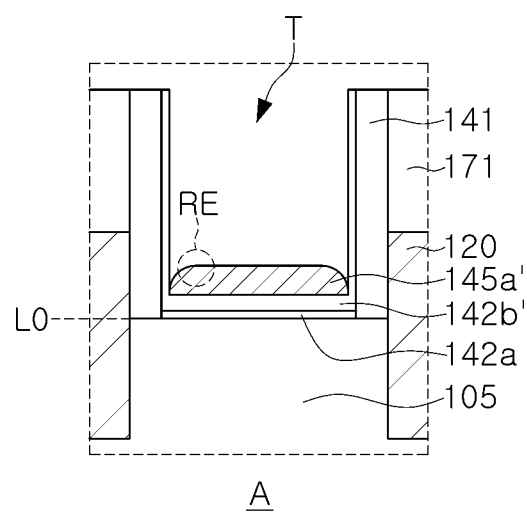

Next, referring to FIG. 8D, a first gate electrode 145a' may be deposited on an inner surface of the treated trench T, and the metal carbide layer CI may be removed. In this embodiment, the first gate electrode 145a' may not be formed on the metal carbide layer CI processed in the previous process, but may be formed on the bottom surface of the trench T, e.g., a bottom portion of the second gate insulating film 142b'. In the process of depositing the first gate electrode 145a', an edge portion of the first gate electrode 145a' may have a small thickness (or a rounded structure) by the metal carbide layer CI or in the process of removing the other material layer CI. For example, the edge portion of the first gate electrode 145a' may have a thickness smaller than a thickness of a central portion of the first gate electrode 145a'. This structure may further reduce a work function delta of the gate electrode in the X-direction.

Figure 9A:
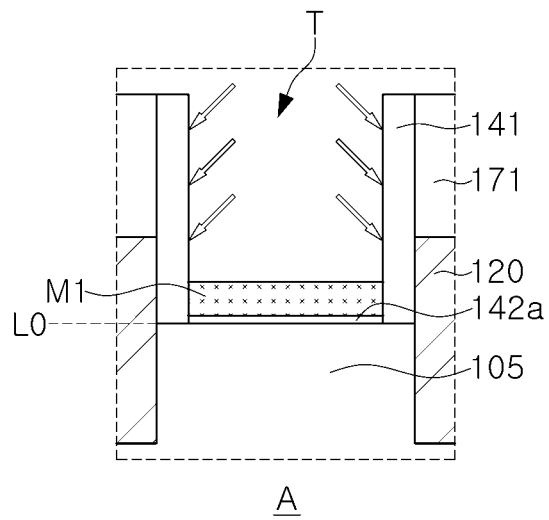
FIGS. 9A, 9B, 9C and 9D are cross-sectional views illustrating a method of manufacturing a semiconductor device according to an exemplary embodiment of the present inventive concept.
Figure 9C:
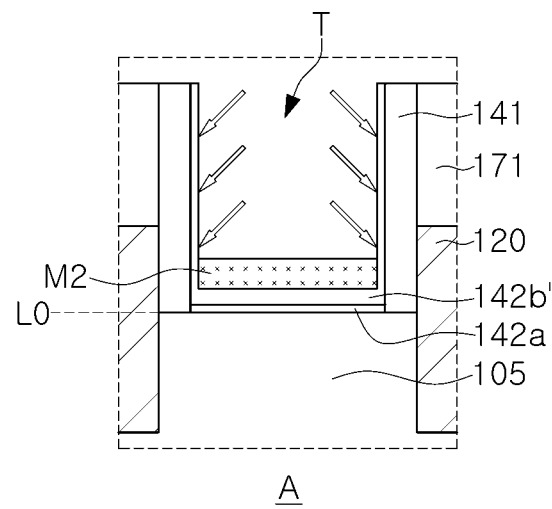
Figure 9B:
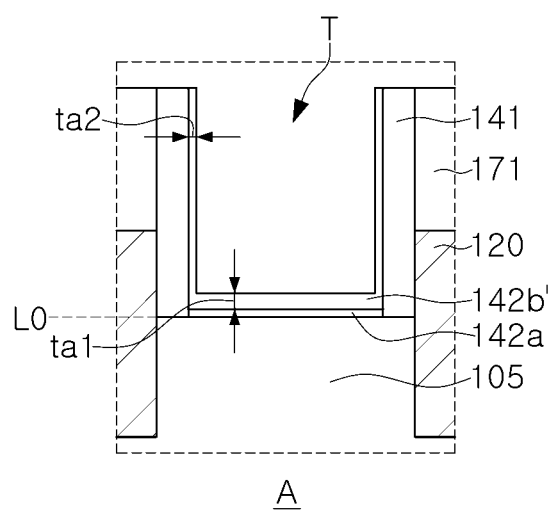
Figure 9D:
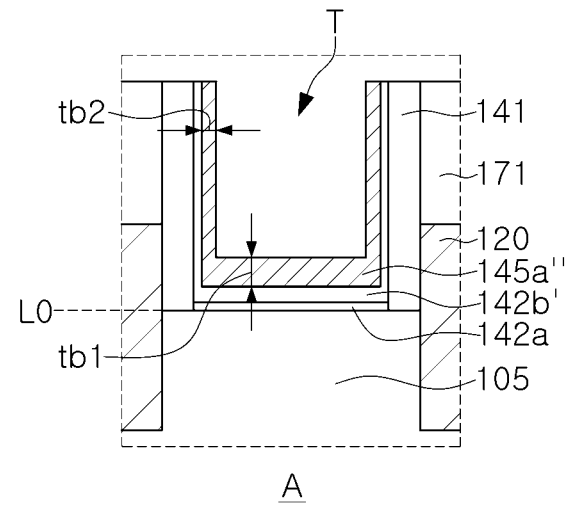

In an exemplary embodiment of the present inventive concept, the first gate electrode 145a' may be formed to have a relatively thin thickness even at a portion of the second gate insulating film 142b' extending along the inner sidewall of the gate spacer 141, similar to a gate electrode 145a", as illustrated in FIG. 9D.

FIGS. 9A to 9D are cross-sectional views illustrating a method of manufacturing a semiconductor device according to an exemplary embodiment of the present inventive concept, using an inhibitor to which selectivity is added by using masks M1 and M2, and/or a plasma treatment.

Referring to FIG. 9A, a PVD process having high linearity may be used to form a first mask layer M1 on a bottom surface of a trench T and apply an inhibitor and/or plasma treatment.

In the process of forming the first mask layer M1, a mask material layer deposited on an inner sidewall of a gate spacer 141 may be removed by, for example, atomic layer etching (ALE). The inhibitor and/or the plasma treatment used in this embodiment may be performed similarly to the process illustrated in FIG. 8A, but since the first mask layer M1 may be used, selectivity of the inhibitor and/or the plasma treatment itself might not be required. Deposition of a second gate insulating film on the inner sidewall of the gate spacer 141 may be suppressed by this process.

Next, referring to FIG. 9B, after the first mask layer M1 is removed, a second gate insulating film 142b' may be deposited on an inner surface of a treated trench T. Similar to the process of FIG. 8B, while the second gate insulating film 142b' may be formed to have a thin thickness on the inner sidewall of the gate spacer 141, the second gate insulating film 142b' may be deposited on a first gate insulating film 142a. In an exemplary embodiment of the present inventive concept, a thickness ta2 of a portion of the second gate insulating film 142b' disposed on the inner sidewall of the gate spacer 141 may be about 50% or less of a thickness ta1 of a portion of the second gate insulating film 142b' disposed on the first gate insulating film 142a.

Next, referring to FIG. 9C, similar to the process of FIG. 9A, a second mask layer M2 may be formed on a bottom surface of the trench T, e.g., on a bottom portion of the second gate insulating film 142b', and an inhibitor and/or plasma treatment may be applied.

Next, referring to FIG. 9D, after removing the second mask layer M2, a first gate electrode 145a" may be deposited on an inner surface of a treated trench T. Similar to the process of FIG. 9B, the first gate electrode 145a" may be deposited. The first gate electrode 145a" may be formed to have a thin thickness on a portion of the second gate insulating film 142b' extending along the inner sidewall of the gate spacer 141. In addition, the first gate electrode 145a" may be deposited on a bottom portion of the second gate insulating film 142b'. For example, a thickness tb2 of a portion of the first gate electrode 145a" disposed on the inner sidewall of the gate spacer 141 may be about 50% or less of a thickness tb1 of a portion of the first gate electrode 145a" disposed on the first gate insulating film 142a. The first and second mask layers M1 and M2 used in this embodiment may include nitrides, such as SiN, TiN, TiON, WN, and AlN, or carbides such as graphene, SiC, AlC, WC, and TiC.

FIGS. 10A to 10D are cross-sectional views illustrating a method of manufacturing a semiconductor device according to an exemplary embodiment of the present inventive concept, using plasma treatment having high linearity.

Figure 10A:
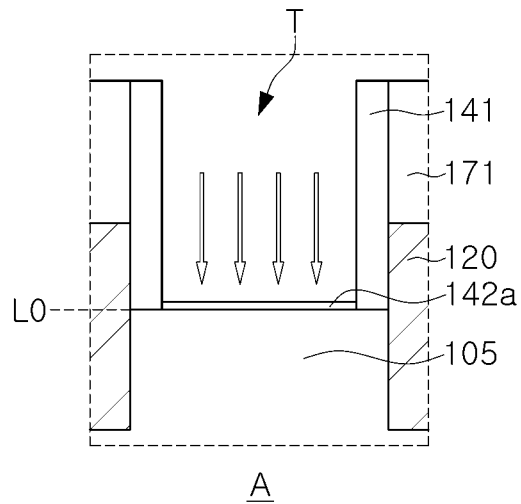
FIGS. 10A, 10B, 10C and 10D are cross-sectional views illustrating a method of manufacturing a semiconductor device according to an exemplary embodiment of the present inventive concept.

Referring to FIG. 10A, at a bottom surface of a trench T, a first gate insulating film 142a may be modified using a plasma having high linearity. For example, the plasma may be a plasma including $N_2O$ and/or $O_2$. More smooth deposition of the first gate insulating film 142a may be ensured by this modification process.

Figure 10C:
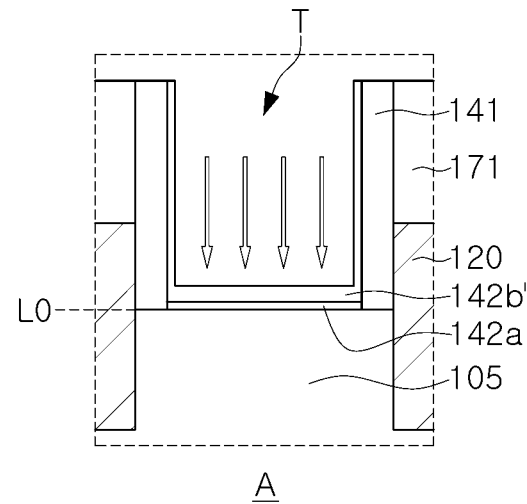
Figure 10B:
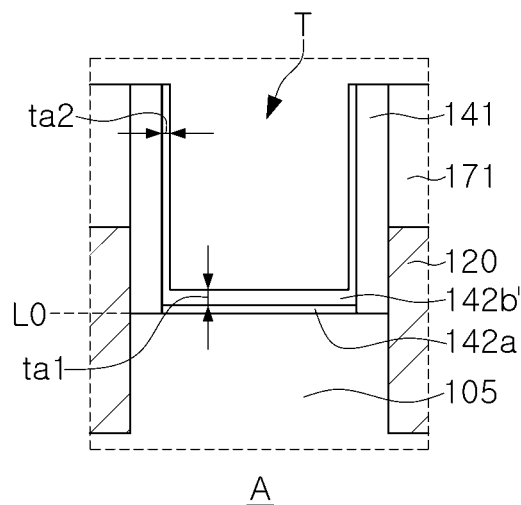

Next, referring to FIG. 10B, a second gate insulating film 142b' may be deposited on an inner surface of the trench T. In addition to a conventional ALD process, a catalytic ALD process may be used for this deposition process. Similar to the processes of FIGS. 8B and 9B, while the second gate insulating film 142b' may be formed to have a thin thickness on an inner sidewall of the gate spacer 141, the second gate insulating film 142b' may be deposited on the first gate insulating film 142a. In exemplary embodiment of the present inventive concept, a thickness ta2 of a portion of the second gate insulating film 142b' disposed on the inner sidewall of the gate spacer 141 may be about 50% or less of a thickness ta1 of a portion of the second gate insulating film 142b' disposed on the first gate insulating film 142a.

Next, referring to FIG. 10C, similar to the process of FIG. 10A, a bottom portion of the second gate insulating film 142b' may be modified using a plasma having high linearity. For example, the plasma may be a plasma containing $N_2O$ and/or $O_2$.

Figure 10D:
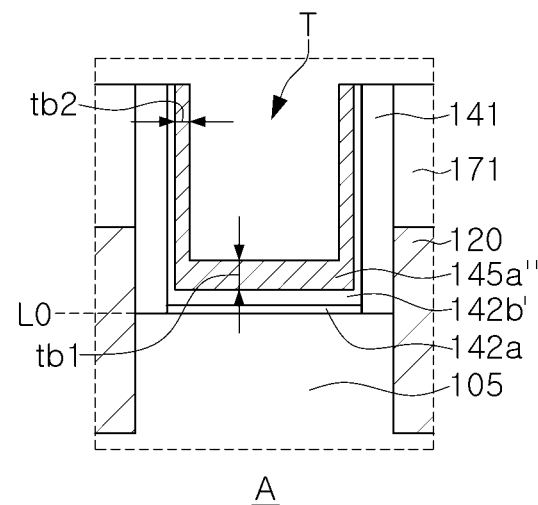

Next, referring to FIG. 10D, a first gate electrode 145a" may be deposited on the inner surface of the trench T. Similar to the process of FIG. 9D, the first gate electrode 145a" may be formed to have a thin thickness on a portion of the second gate insulating film 142b', extending to the inner sidewall of the gate spacer 141, while the first gate electrode 145a" may be smoothly deposited on a bottom portion of the second gate insulating film 142b'. For example, a thickness tb2 of a portion of the first gate electrode 145a" disposed on the inner sidewall of the gate spacer 141 may be about 50% or less of a thickness tb1 of a portion of the first gate electrode 145a" disposed on the first gate insulating film 142a.

Figure 11A:
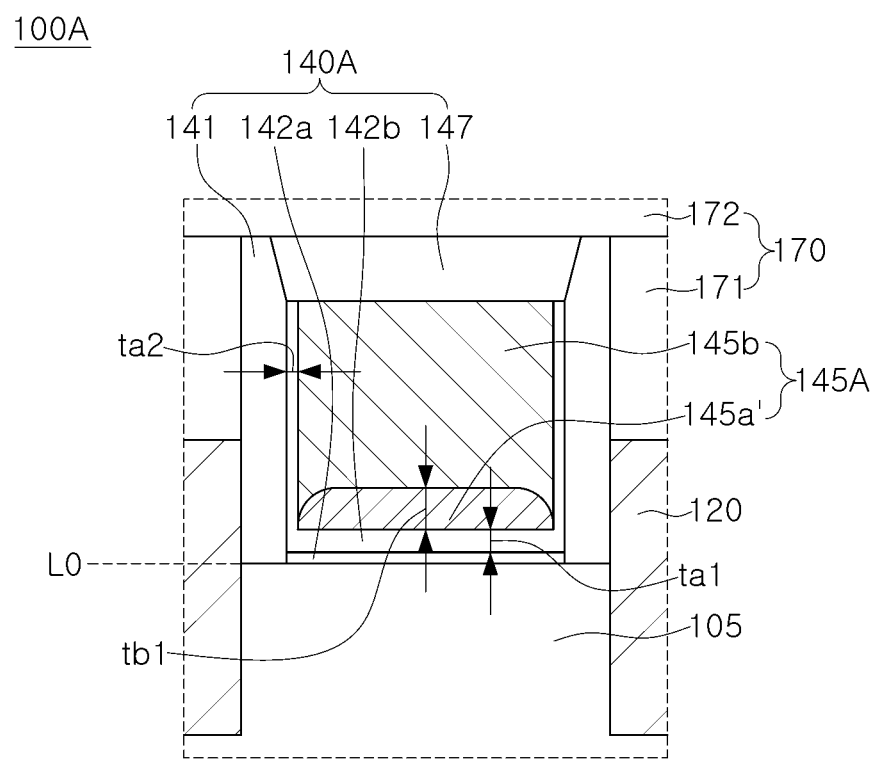
FIGS. 11A and 11B are cross-sectional views illustrating a semiconductor device according to an exemplary embodiment of the present inventive concept.
Figure 11B:
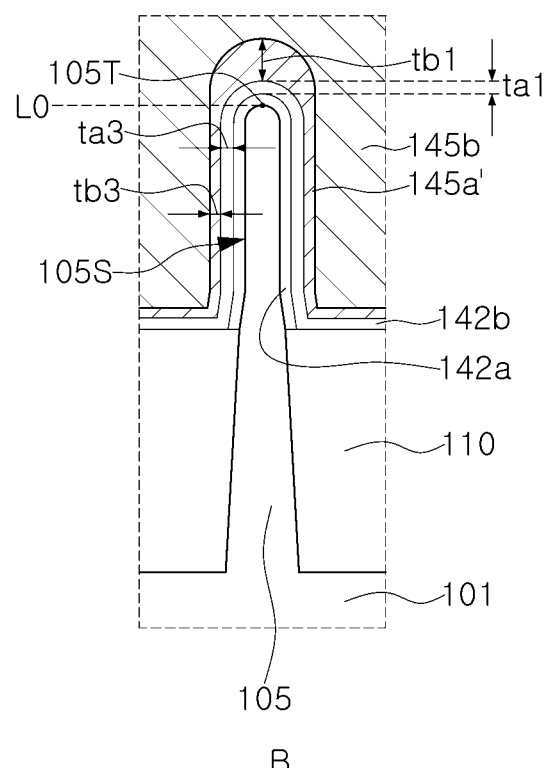

FIGS. 11A and 11B are cross-sectional views illustrating a semiconductor device according to an exemplary embodiment of the present inventive concept, and can be understood as being a semiconductor device manufactured using the process illustrated in FIGS. 8A to 8D.

It can be understood that a semiconductor device 100A illustrated in FIGS. 11A and 11B is similar to the semiconductor device 100 illustrated in FIGS. 3A and 3B, except that thickness distributions of a second gate insulating film 142b and a cross-sectional shape of a first gate electrode 145a' are different from those illustrated in FIGS. 3A and 3B, and a gap fill electrode (145c of FIG. 3B) is omitted. In addition, components of this embodiment can be understood with reference to descriptions of the same or similar components of the embodiments illustrated in FIGS. 1 to 3B, unless otherwise specified.

A gate structure 140A employed in this embodiment may include a first gate insulating film 142a and a second gate insulating film 142b, sequentially disposed on upper and lateral surfaces of a plurality of active fins 105. In the cross-section illustrated in FIG. 11A, the second gate insulating film 142b has a U-shaped shape having an extended portions extending between a pair of gate spacers 141 and a second gate electrode 145b. For example, the extended portions extend from a bottom portion of the second gate insulating film 142b disposed on the first gate insulating film 142a, and the second gate insulating film 142b has an opening between the extended portions of the second gate insulating film 142. A thickness ta2 of the extended portion of the second gate insulating film 142b may be smaller than a thickness ta1 of a portion (e.g., a bottom portion) of the second gate insulating film 142b located on the first gate insulating film 142a. For example, the thickness ta2 of the extended portion of the second gate insulating film 142b may be about 50% or less of the thickness ta1 of the portion located on the first gate insulating film 142a.

Referring to FIG. 11B, a thickness ta3 of a portion of the second gate insulating film 142b located on a lateral surface 105S of the active fin 105 may be equal to or shorter than the thickness ta1 of the portion of the second gate insulating film 142a located on the first gate insulating film 142a, and may be greater than the thickness ta2 of the extended portions of the second gate insulating film 142b. For example, as illustrated in FIG. 8A, since the inner sidewall of the gate spacer 141 may be substantially vertical, and deposition may be suppressed by an inhibitor or plasma treatment, while the lateral surface 105S of the active fin 105 may have a slight inclined portion and deposition may not be suppressed, the thickness ta3 of the portion of the second gate insulating film 142b located on the lateral surface 105S of the active fin 105 may be greater than the thickness ta2 of the extended portions of the second gate insulating film 142b.

A gate electrode 145A employed in this embodiment may include first and second gate electrodes 145a' and 145b, and, unlike the previous embodiments, may not include a capping electrode, or may not illustrate a capping electrode in its cross-sectional view. Similar to the previous embodiments, the first gate electrode 145a' may be formed only on a bottom surface of a trench T, e.g., a bottom portion of the second gate insulating film 142b. An edge portion of the first gate electrode 145a' employed in this embodiment may have a thickness (or a rounded structure) slightly smaller than a thickness of a central portion of the first gate electrode 145a'. This structure may further reduce work function delta of the gate electrode 145A in the X-direction. As described above, in the first gate electrode 145a, a thickness tb1 of a portion of the first gate electrode 145a' located on the upper surface 105T of the active fin 105 may be greater than a thickness tb3 of a portion of the first gate electrode 145a' located on the lateral surface 105S of the active fin 105 (see FIG. 11B).

Figure 12A:
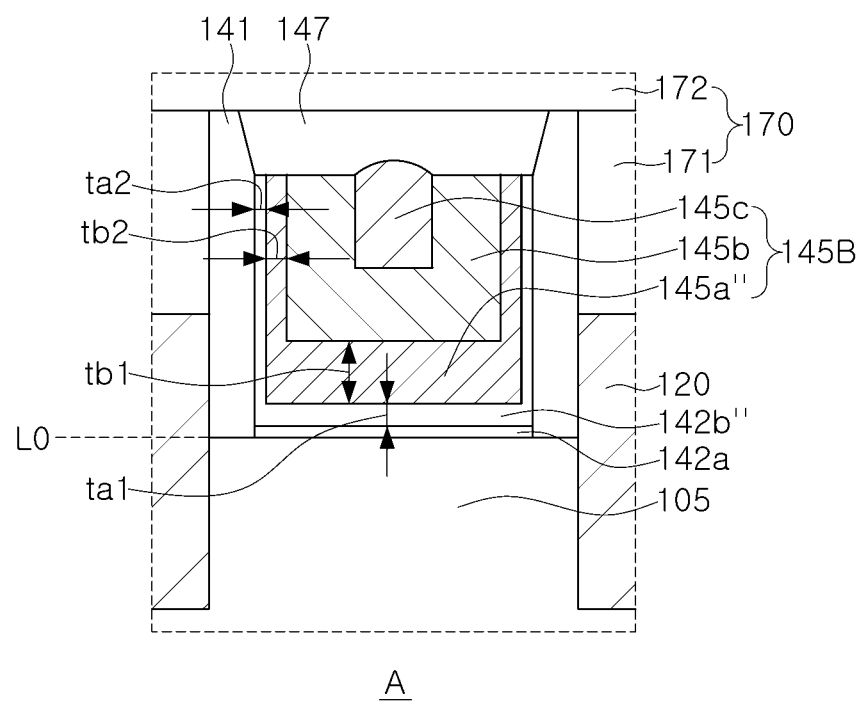
FIGS. 12A and 12B are cross-sectional views illustrating a semiconductor device according to an exemplary embodiment of the present inventive concept.
Figure 12B:
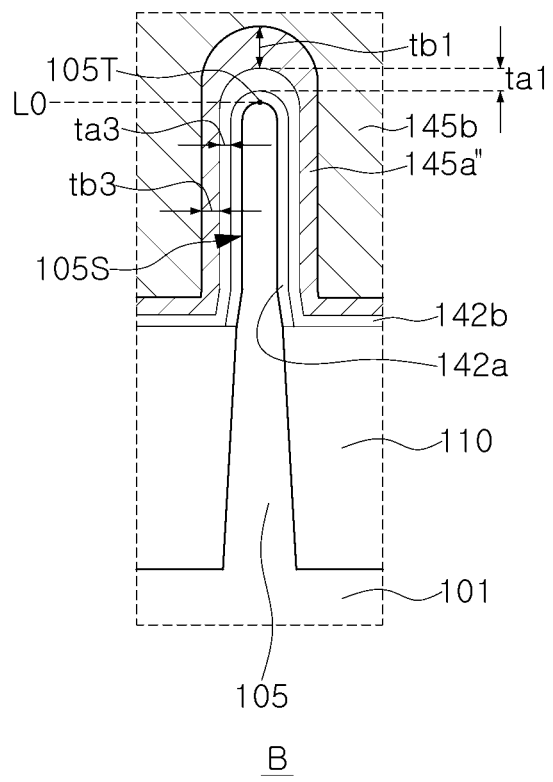

FIGS. 12A and 12B are cross-sectional views illustrating a semiconductor device according to an exemplary embodiment of the present inventive concept, and can be understood as a semiconductor device manufactured using the process illustrated in FIGS. 9A to 9D.

It can be understood that a semiconductor device 100B illustrated in FIGS. 12A and 12B is similar to the semiconductor device 100 illustrated in FIGS. 3A and 3B, except that cross-sectional shapes of a second gate insulating film 142b" and a first gate electrode 145a" are different from those illustrated in FIGS. 3A and 3B. In addition, components of this embodiment can be understood with reference to descriptions of the same or similar components of the embodiments illustrated in FIGS. 1 to 3B, unless otherwise specified.

Unlike the embodiments illustrated in FIGS. 3A and 3B, a gate structure employed in this embodiment may include a second gate insulating film 142b" and a first gate electrode 145a", each of which have a portion extending along an inner sidewall of a gate spacer 141.

In a cross-sectional view illustrated in FIG. 12A, the second gate insulating film 142b" has a U-shape having portions extending between a pair of gate spacers 141 and the second gate electrode 145b". Similarly, the first gate electrode 145a" may have a U shape having portions extending along an extended portion of the second gate insulating film 142b".

Similar to FIGS. 11A and 11B, a thickness ta2 of the extended portions of the second gate insulating film 142b" may be less than a thickness ta1 of a portion of the second gate insulating film 142b" located on a first gate insulating film 142a. For example, the thickness ta2 of the extended portions of the second gate insulating film 142b" may be about 50% or less of the thickness ta1 of the portion of the second gate insulating film 142b" located on the first gate insulating film 142a. A thickness ta3 of the portion of the second gate insulating film 142b" located on the lateral surface 105S of the active fin 105 may be equal to or less than the thickness ta1 of the portion of the second gate insulating film 142b" located on the first gate insulating film 142a, but may be greater than the thickness ta2 of the extended portions of the second gate insulating film 142b".

A thickness tb2 of the extended portion of the first gate electrode 145a" employed in this embodiment may be less than a thickness tb1 of a portion of the first gate electrode 145a" located on a bottom portion of the second gate insulating film 142b". For example, the thickness tb2 of the extended portion of the first gate electrode 145a" may be about 50% or less of the thickness tb1 of the portion of the first gate electrode 145a located on the bottom portion of the second gate insulating film 142b". In addition, a thickness tb3 of a portion of the first gate electrode 145a" located on the lateral surface 105S of the active fin 105 may be equal to or less than the thickness tb1 of the portion of the first gate electrode 145a" located on the bottom portion of the second gate insulating film 142b", but may be greater than the thickness tb2 of the extended portion of the first gate electrode 145a". As illustrated in FIGS. 9C and 9D, since the extended portion of the second gate insulating film 142b" may be substantially vertical, and deposition may be selectively suppressed through use of an inhibitor or plasma treatment, while the lateral surface 105S of the active fin 105 may have a somewhat inclined portion and deposition may not be suppressed, the thickness tb3 of the portion of the first gate electrode 145a" located on the lateral surface 105S of the active fin 105 may be greater than the thickness tb2 of the extended portion of the first gate electrode 145a". However, the present inventive concept is not limited thereto. For example, the thickness tb3 of the portion of the first gate electrode 145a" located on the lateral surface 105S of the active fin 105 may be substantially equal to the thickness tb2 of the extended portion of the first gate electrode 145a".

The semiconductor device 300 according to this embodiment may be implemented by a transistor (i.e., MBCFET®) having a nanosheet. However, components of the semiconductor device according to this embodiment may be described with reference to description in terms of components of a semiconductor device 100C illustrated in FIGS. 13A and 13B, unless there is a description contrary to the features according to this embodiment. In addition, FIGS.

13A and 13B may be understood as cross-sectional views, corresponding to the cross-sectional views of FIGS. 2A and 2B, respectively.

Figure 13A:
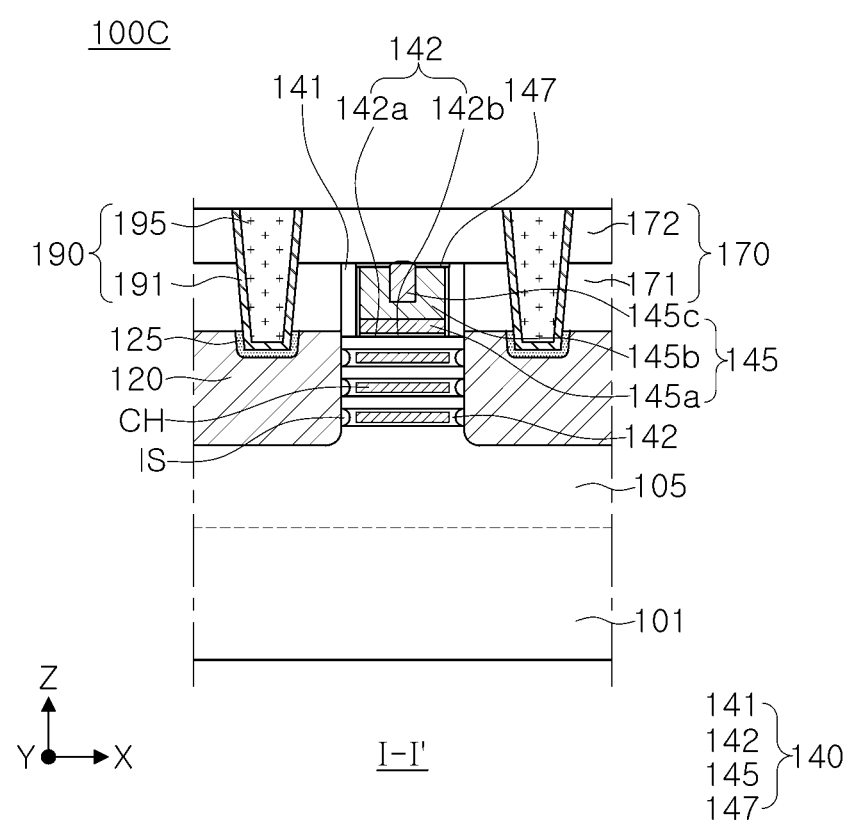
FIGS. 13A and 13B are cross-sectional views illustrating a semiconductor device according to an exemplary embodiment of the present inventive concept.
Figure 13B:
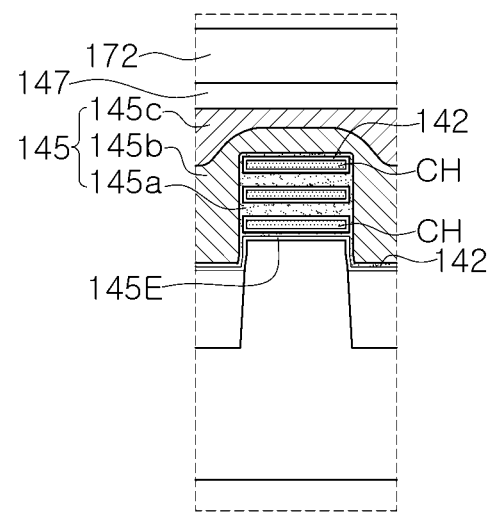

Referring to FIGS. 13A and 13B, a semiconductor device 100C may further include internal spacer layers IS disposed parallel to a gate electrode layer portion 145E disposed between a plurality of channel layers CH and a plurality of channel layers CH, disposed apart from each other perpendicularly on an active fin 105 with respect to an upper surface of the active fin 105. The semiconductor device 100C may include transistors of a gate-all-around type structure in which a gate electrode 145 and the gate electrode layer portion 145E are disposed between the active fins 105 and the channel layers CH and between the plurality of nano-sheet-shaped channel layers CH. For example, the semiconductor device 100C may include transistors including channel layers CH, source/drain regions 120, and the gate electrode 145 and the gate electrode layer portion 145E. The gate electrode layer portion 145E located between the plurality of channel layers CH may include a material of a first gate electrode 145a, or a combination of a material of the first gate electrode 145a and a material of a second gate electrode 145b.

The plurality of channel layers CH may be disposed on the active fin 105 as a plurality of two or more channel layers CH spaced apart from each other in a direction substantially perpendicular to an upper surface of the active fin 105, for example, in the third direction (e.g., the Z-axis direction). The channel layers CH may be connected to the source/drain regions 120 and may be spaced apart from the upper surface of the active fin 105. The channel layers CH may have the same or similar width as the active fin 105 in the second direction (e.g., the Y-axis direction), and may have the same or similar width as a gate structure 140 in the first direction (e.g., the X-axis direction). As in this embodiment, when the internal spacer layers IS are employed, the channel layers CH may have a width smaller than a width between respective lateral surfaces of the active fin 105 below the gate structure 140.

The plurality of channel layers CH may be formed of a semiconductor material, and may include, for example, at least one of silicon (Si), silicon germanium (SiGe), and/or germanium (Ge). The channel layers CH may be formed of, for example, the same material as a substrate 101. The number and shape of the channel layers CH forming one (1) channel structure CH may be variously changed in the present inventive concept. For example, according to an exemplary embodiment of the present inventive concept, the channel layer CH may be located in a region in which the active fins 105 are overlap with the gate electrode layers 145 and 145E.

The gate structure 140 may be disposed on the active fin 105 and the plurality of channel layers CH, to cross and extend from the active fin 105 and the plurality of channel layers CH. Channel regions of transistors may be formed in the active fin 105 and the plurality of channel layers CH intersecting the gate structure 140. In this embodiment, the gate insulating film 142 may be disposed not only between the active fin 105 and the gate electrodes 145 and 145E, but also between the plurality of channel layers CH and the gate electrode 145E. The gate electrode 145 may be disposed on the active fins 105, to fill gaps between the plurality of channel layers CH and extend over the plurality of channel layers CH. The gate electrodes 145 and 145E may be spaced apart from the plurality of channel layers CH by the gate insulating film 142.

The internal spacer layers IS may be disposed in parallel with the gate electrodes 145 and 145E between the plurality of channel layers CH. The gate electrodes 145 and 145E may be spaced apart from the source/drain regions 120 by internal spacer layers IS and may be electrically separated. For example, the gate electrodes 145 and 145E may be electrically separated from the source/drain regions 12. For example, the internal spacer layers IS may have a flat lateral surface facing the gate electrodes 145 and 145E or may have a shape that may be convexly rounded inwardly toward the gate electrodes 145 and 145E. For example, the internal spacer layer IS may have a hemispherical shape. The internal spacer layers IS may be made of oxide, nitride, and oxynitride, and for example, may be made of a low-k film.

As described above, the semiconductor device according to an exemplary embodiment of the present inventive concept may be applied to a transistor having various structures, and may be implemented as a semiconductor device including a vertical FET (VFET) having an active region extending perpendicularly to an upper surface of a substrate and a gate structure surrounding the same, or as a semiconductor device including a negative capacitance FET (NCFET) using a gate insulating film having ferroelectric properties, in addition to the above-described embodiments.

According to an exemplary embodiment of the present inventive concept, a semiconductor device having increased gate controllability, in which a difference between a physical distance between a gate electrode and an active fin may be reduced, may be provided.

While the present inventive concept has been particularly shown and described with reference to exemplary embodiments thereof, it will be apparent to those of ordinary skill in the art that various changes in form and detail may be made thereto without departing from the spirit and scope of the present inventive concept.

What is claimed is:

1. A semiconductor device comprising:
    at least one active fin disposed on a substrate and extending in a first direction;
    a gate structure overlapping the at least one active fin and extending in a second direction intersecting the first direction;
    source/drain regions disposed on both sides of the gate structure and on the at least one active fin; and
    contact structures respectively connected to the source/drain regions, and extending in a third direction substantially perpendicular to the first and second directions,
    wherein the gate structure comprises:
    a pair of gate spacers spaced apart from each other in the first direction to provide a trench, and extending in the second direction;
    a first gate electrode disposed in the trench and extending along an upper surface and a lateral surface of the at least one active fin in the second direction;
    a second gate electrode disposed on the first gate electrode in the trench, wherein the first gate electrode is not disposed between the second gate electrode and the pair of gate spacers; and
    a gate insulating film disposed between the pair of gate spacers and interposed between the first gate electrode and the at least one active fin.

2. The semiconductor device of claim 1, wherein the gate insulating film includes a first extended portion and a second extend portion, wherein the first extended portion is disposed between a first gate spacer of the pair of gate spacers and a first side of the second gate electrode, and the second extended portion is disposed between a second gate spacer of the pair of gate spacers and a second side of the second gate electrode.

3. The semiconductor device of claim 2, wherein the second gate electrode is in contact with the first and second extended portions of the gate insulating film.

4. The semiconductor device of claim 2, wherein the second gate electrode comprises a material having a work function greater than that of the first gate electrode.

5. The semiconductor device of claim 4, wherein the first gate electrode comprises at least one of TiN, TaN, W, WCN, and combinations thereof, and
the second gate electrode comprises at least one of TiAl, TiAlC, TiAlN, and combinations thereof.

6. The semiconductor device of claim 4, wherein the second gate electrode includes first and second extended portions extending along the first and second extended portions of the gate insulating film, respectively.

7. The semiconductor device of claim 6, wherein the gate structure further comprises a gap fill electrode filled in a space between the first and second extended portions of the second gate electrode.

8. The semiconductor device of claim 7, wherein the gate structure further comprises a capping pattern disposed on the gap fill electrode and the second gate electrode and filling the trench.

9. The semiconductor device of claim 1, wherein the first gate electrode includes a first thickness of a portion located on the upper surface of the at least one active fin that is greater than a second thickness of a portion located on the lateral surface of the at least one active fin.

10. The semiconductor device of claim 1, wherein the gate insulating film comprises a first gate insulating film disposed along the upper surface and the lateral surface of the at least one active fin, and a second gate insulating film disposed on the first gate insulating film and having portions extending along an inner sidewall of each of the pair of gate spacers.

11. The semiconductor device of claim 10, wherein the second gate insulating film has a first extended portion and a second extended portion, wherein the first extended portion is disposed between a first gate spacer of the pair of gate spacers and the second gate electrode, and the second extended portion is disposed between a second gate spacer of the pair of gate spacers and the second gate electrode,
wherein a thickness of each of the first and second extended portions of the second gate insulating film is less than a thickness of a portion of the second gate insulating film located on the first gate insulating film.

12. The semiconductor device of claim 11, wherein the thickness of each of the first and second extended portions of the second gate insulating film is about 50% or less of the thickness of the portion of the second gate insulating film located on the first gate insulating film.

13. The semiconductor device of claim 11, wherein a portion of the second gate insulating film located on the lateral surface of the at least one active fin has a thickness equal to or less than the thickness of the portion of the second gate insulating film located on the first gate insulating film, and the thickness of the portion of the second gate insulating film located on the lateral surface of the at least one active fin is greater than the thickness of each of the first and second extended portions of the second gate insulating film.

14. A semiconductor device comprising:
at least one active fin disposed on a substrate and extending in a first direction;
a pair of gate spacers spaced apart from each other at a predetermined distance in the first direction and extending in a second direction intersecting the first direction;
a first gate insulating film disposed between the pair of gate spacers and along an upper surface and a lateral surface of the at least one active fin in the second direction;
a second gate insulating film having a first portion, a second portion and a third portion, wherein the first portion is disposed on the first gate insulating film, wherein the second and third portions extend from the first portion and along an inner sidewall of each of the pair of gate spacers, respectively, and wherein a thickness of each of the second and third portions is less than a thickness of the first portion;
a first gate electrode disposed on the first portion of the second gate insulating film between the pair of gate spacers;
a second gate electrode disposed on the first gate electrode between the pair of gate spacers and overlap the second and third portions of the second gate insulating film;
source/drain regions disposed in portions of the at least one active fin adjacent to the pair of gate spacers; and
contact structures respectively connected to the source/drain regions, and extending in a third direction substantially perpendicular to the first and second directions.

15. The semiconductor device of claim 14, wherein the second gate electrode comprises a material having a work function greater than that of the first gate electrode.

16. The semiconductor device of claim 14, wherein the second gate electrode has first and second extended portions extending along the second and third portions of the second gate insulating film, respectively, and further comprises a gap fill electrode filled in a space between the first and second extended portions of the second gate electrode.

17. The semiconductor device of claim 14, wherein a thickness of the second portion of the second gate insulating film is about 50% or less of a thickness of the first portion of the second gate insulating film, and
a portion of the second gate insulating film located on the lateral surface of the at least one active fin has a thickness equal to or less than a thickness of a portion of the second gate insulating film located on the first gate insulating film, and the thickness of the portion of the second gate insulating film located on the lateral surface of the at least one active fin has a thickness greater than the thickness of the second portion of the second gate insulating film.

18. A semiconductor device comprising:
at least one active fin disposed on a substrate and extending in a first direction;
a pair of gate spacers spaced apart from each other at a predetermined distance in the first direction and extending in a second direction intersecting the first direction;
a first gate insulating film disposed between the pair of gate spacers and along an upper surface and a lateral surface of the at least one active fin in the second direction;
a second gate insulating film having a first portion, a second portion, and a third portion, wherein the first portion is disposed on the first gate insulating film, wherein the second and third portions extend from the first portion and along an inner sidewall of each of the pair of gate spacers, respectively, and wherein a thickness of the second portion is less than a thickness of the first portion;

a first gate electrode disposed between the pair of gate spacers and having a third portion and a fourth portion, wherein the third portion of the first gate contacts the first portion of the second gate insulating film, wherein the fourth portion of the first gate electrode contacts the second portion of the second gate insulating film, wherein a thickness of the fourth portion of the first gate electrode is less than a thickness of the third portion of the first gate electrode; and a second gate electrode disposed on the first gate electrode between the pair of gate spacers.

19. The semiconductor device of claim 18, wherein the thickness of the second portion of the second gate insulating film is about 50% or less of the thickness of the first portion of the second gate insulating film, and the thickness of the fourth portion of the first gate electrode is about 50% or less of the thickness of the third portion of the first gate electrode.

20. The semiconductor device of claim 19, wherein a portion of the second gate insulating film located on the lateral surface of the at least one active fin has a thickness equal to or less than a thickness of a portion of the second gate insulating film located on the first gate insulating film, and has a thickness greater than the thickness of the second portion of the second gate insulating film.

* * * * *